United States Patent
Majima et al.

(10) Patent No.: US 9,825,161 B2
(45) Date of Patent: Nov. 21, 2017

(54) LOGICAL OPERATION ELEMENT

(71) Applicant: JAPAN SCIENCE AND TECHNOLOGY AGENCY, Kawaguchi-shi, Saitama (JP)

(72) Inventors: Yutaka Majima, Yokohama (JP); Toshiharu Teranishi, Uji (JP); Kazuhiko Matsumoto, Ibaraki (JP); Kenzo Maehashi, Ibaraki (JP); Tomofumi Susaki, Yokohama (JP); Yasuhide Ohno, Ibaraki (JP); Kosuke Matsuzaki, Yokohama (JP); Guillaume Hubert Frederic Hackenberger, Yokohama (JP)

(73) Assignee: JAPAN SCIENCE AND TECHNOLOGY AGENCY, Kawaguchi-shi, Saitama (JP)

( * ) Notice: Subject to any disclaimer, the term of this patent is extended or adjusted under 35 U.S.C. 154(b) by 0 days.

(21) Appl. No.: 14/773,581

(22) PCT Filed: Mar. 9, 2014

(86) PCT No.: PCT/JP2014/056079
§ 371 (c)(1),
(2) Date: Sep. 8, 2015

(87) PCT Pub. No.: WO2014/142039
PCT Pub. Date: Sep. 18, 2014

(65) Prior Publication Data
US 2016/0027908 A1 Jan. 28, 2016

(30) Foreign Application Priority Data
Mar. 9, 2013 (JP) ................................ 2013-047421

(51) Int. Cl.
*H01L 29/76* (2006.01)
*B82Y 10/00* (2011.01)
(Continued)

(52) U.S. Cl.
CPC .......... *H01L 29/7613* (2013.01); *B82Y 10/00* (2013.01); *B82Y 40/00* (2013.01);
(Continued)

(58) Field of Classification Search
CPC ... B82Y 10/00; B82Y 40/00; H01L 29/66439; H01L 29/7613; H01L 29/0665; H01L 29/4232; H01L 29/41725; H01L 29/127
(Continued)

(56) References Cited

U.S. PATENT DOCUMENTS 5,989,947 A * 11/1999 Dilger ................... B82Y 10/00
257/E21.408
6,791,338 B1 * 9/2004 Bratkovski ............ B82Y 10/00
257/29
(Continued)

FOREIGN PATENT DOCUMENTS

| JP | 6-196720 A | 7/1994 |
|---|---|---|
| JP | 9-102616 A | 4/1997 |

(Continued)

OTHER PUBLICATIONS

International Search Report dated Jun. 3, 2014, issued in counterpart application No. PCMP2014/056079.
(Continued)

*Primary Examiner* — Bo Fan
(74) *Attorney, Agent, or Firm* — Westerman, Hattori, Daniels & Adrian, LLP

(57) ABSTRACT

Provided is a logical operation element that performs logical operations on three or more inputs using a single unique device. The logical operation element 30 is provided with an (Continued)

electrode 5A and the other electrode 5B that are provided to have a nanogap, a metal nanoparticle 7 arranged between the electrode 5A and the other electrode 5B in insulated state, and a plurality of gate electrodes 5C, 5D, 11, 11A, 11B for adjusting a charge of the metal nanoparticle 7. Electric current that flows between the electrode 5A and the other electrode 5B is controlled in accordance with the voltage applied to three or more of the gate electrodes 5C, 5D, 11, 11A, 11B.

13 Claims, 20 Drawing Sheets

(51) Int. Cl.
| B82Y 40/00 | (2011.01) |
| H01L 29/66 | (2006.01) |
| H01L 29/12 | (2006.01) |
| H01L 29/06 | (2006.01) |
| H01L 29/417 | (2006.01) |
| H01L 29/423 | (2006.01) |

(52) U.S. Cl.
CPC ........ *H01L 29/0665* (2013.01); *H01L 29/127* (2013.01); *H01L 29/41725* (2013.01); *H01L 29/4232* (2013.01); *H01L 29/66439* (2013.01)

(58) Field of Classification Search
USPC .................. 438/765; 257/21, 24; 463/22
See application file for complete search history.

(56) References Cited

U.S. PATENT DOCUMENTS

| 2002/0134996 | A1* | 9/2002 | Morie | B82Y 10/00 257/206 |
| 2003/0162587 | A1* | 8/2003 | Tanamoto | B82Y 10/00 463/22 |
| 2007/0215860 | A1* | 9/2007 | Komiyama | B82Y 10/00 257/21 |
| 2008/0108227 | A1* | 5/2008 | Kumagai | B82Y 10/00 438/765 |
| 2009/0130427 | A1* | 5/2009 | Grigoropoulos | B41M 5/42 428/323 |
| 2010/0308328 | A1* | 12/2010 | Makihara | B82Y 10/00 257/48 |

FOREIGN PATENT DOCUMENTS

| JP | 4054881 B2 | 3/2008 |
| JP | 4873335 B2 | 2/2012 |

OTHER PUBLICATIONS

Yasutake et al.,: "Simultaneous fabrication of nanogap gold electrodes by electroless gold plating using a common medical liquid"; Applied Physics Letters 91, 2003107 (2007); pp. 203107-1 thru 203107-3.

Serdio et. al.; "Robust nanogap electrodes by self-terminating electroless gold plating"; The Royal Society of Chemistry 2012; Nanoscale, 2012, 4, pp. 7161-7167.

Okabayashi et al.; Uniform charging energy of single-electron transistors by using size-controlled Au nanoparticles; Applied Physics Letters 100, (2012); pp. 033101-1 thru 033101-3.

Maeda et al.; "Logic Operations of Chemically Assembled Single-Electron Transistor"; Acsnano, vol. 6, No. 3, pp. 2798-2803.

Inokawa et al.; "A Multiple—Valued Logic and Memory with Merged Single-Electron and MOS Transistors"; NTT Basic Research Laboratories, NTT Corporation; pp. 15-20.

Kano et al., "Room-Temperature Coulomb Blockade from Chemically Synthesized Au Nanoparticles Stabilized by Acid-Base Interaction"; Applied Physics Express 3 (2010); pp. 105003-1 thru 105003-3.

* cited by examiner

LOGICAL OPERATION ELEMENT

TECHNICAL FILED

The present invention relates to a logical operation element having a three or more gates.

BACKGROUND OF ART

To establish manufacturing technology for the single electron transistor, the inventors have focused on a gold nanoparticle as Coulomb island in single-electron device, and used STM (Scanning Tunneling Microscope) and clarified that the gold nanoparticle with particle diameter of 1.8 nm functioned as Coulomb island at ambient temperature. In addition, to construct an electronic device on solid substrate, the inventors used electroless plating and established the method for manufacturing nanogap electrodes with a gap separation of 5 nm at a high yield rate at a time. Furthermore, the inventors reported on function of the single electron transistor, in which the gold nanoparticle was placed between the nanogap electrodes by chemical adsorption (Non-Patent Literatures 1 to 6).

CITATION LIST

Non-Patent Literature

Non-patent literature 1: S. Kano, Y. Azuma, M. Kanehara, T. Teranishi, Y. Majima, Appl. Phys. Express, 3, 105003 (2010)

Non-patent literature 2: Y. Yasutake, K. Kono, M. Kanehara, T. Teranishi, M. R. Buitelaar, C. G. Smith, Y. Majima, Appl. Phys. Lett., 91, 203107 (2007)

Non-patent literature 3: Victor M. Serdio V., Yasuo Azuma, Shuhei Takeshita, Taro Muraki, Toshiharu Teranishi and Yutaka Majima, Nanoscale, 4, 7161 (2012)

Non-patent literature 4: N. Okabayashi, K. Maeda, T. Muraki, D. Tanaka, M. Sakamoto, T. Teranishi, Y. Majima, Appl. Phys. Lett., 100, 033101 (2012)

Non-patent literature 5: Kosuke Maeda, Norio Okabayashi, Shinya Kano, Shuhei Takeshita, Daisuke Tanaka, Masanori Sakamoto, Toshiharu Teranishi, and Yutaka Majima, ACS Nano, 6, 2798 (2012) Non-patent literature 6: Hiroshi Igawa, Satoshi Fujiwara, Yasuo Takahashi, Technical Report of IEICE, ED2001-241, SDM2001-250, Page 15 to 20,

SUMMARY OF INVENTION

Technical Problem

However, a three or more input logical operation element using such a single electron transistor has not been realized yet.

In view of the above problems, an object of the present invention is to provide a logical operation element capable of realizing three or more input logical operations with a unique device.

Solution to Problem

In order to achieve an object, the following means are taken in the present.

[1] A logical operation element, comprising:
one electrode and the other electrode provided to have a nanogap;
a metal nanoparticle arranged between the one electrode and the other electrode in insulated state; and
a plurality of gate electrodes for adjusting a charge of the metal nanoparticle;
wherein electric current flowing between the one electrode and the other electrode is controlled according to voltage applied to three or more electrodes of the plurality of gate electrodes.

[2] The logical operation element as set forth in [1], wherein the three or more gate electrodes comprise two side gate electrodes and a top gate electrode.

[3] The logical operation element as set forth in [1], wherein the three or more gate electrodes comprise two side gate electrodes and a bottom gate electrode.

[4] The logical operation element as set forth in [1], wherein the three or more gate electrodes comprise two side gate electrodes, a top gate electrode, and a bottom gate electrode.

[5] The logical operation element as set forth in [2] or [4], wherein the one electrode, the other electrode and two side gate electrodes are provided on a first insulating layer,
a second insulating layer is provided on the first insulating layer to embed the one electrode, the other electrode, the two side gate electrodes, and the metal nanoparticle, and
the top gate electrode is provided on the second insulating layer and above the metal nanoparticle.

[6] The logical operation element as set forth in [1], wherein the three or more gate electrodes comprise a side gate electrode, a top gate electrode, and a bottom gate electrode,
a face where the bottom gate electrode 11A exists, a face where the side gate electrodes exist, and a face where the top gate electrode exists are separated in the vertical direction, and
the metal nanoparticle is provided to be embedded in the insulating layer at a position above the bottom gate electrode 11A and beneath the top gate electrode.

[7] The logical operation element as set forth in [1], wherein a relationship between an input of voltage applied to the three or more gate electrodes and an output of electric current through the metal nanoparticle between the one electrode and the other electrode is XOR or XNOR.

[8] The logical operation element as set forth in [1], wherein, a value is set as a potential difference corresponding to input of High and Low of voltage applied to the three or more gate electrodes, the value corresponds to both ends of one of divisions of voltage difference $\Delta V$ between gate voltage to provide peak current in Coulomb oscillation for one cycle and gate voltage to provide next peak current, the voltage difference $\Delta V$ is equally divided into two, three, or four equal parts.

EFFECTS OF INVENTION

According to the present invention, since one electrode and other electrode are provided so that they have a nanogap, a metal nanoparticle is placed between them in insulated state, and a plurality of gate electrodes are provided at positions allowing the charge of a metal nanoparticle to be changed, the current fed between the one electrode and the other electrode can be controlled according to the voltage applied to three or more electrodes, of the plurality of the gate electrodes. When the three or more electrodes are made up of two side gates and a top gate, or of a side gate, a top gate, and a bottom gate, in particular, the charge of the metal nanoparticle as Coulomb island can be changed in response to the voltage applied to the gate electrodes, and various logical operations such as XOR and XNOR can thus be performed with a single element.

REFERENCE SIGNS LIST

Figure 1:
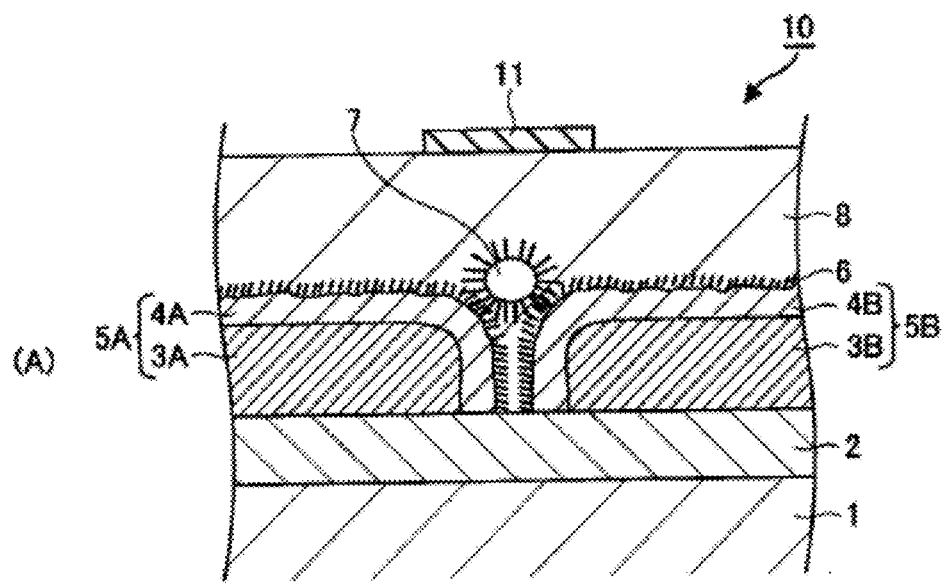
FIG. 1 shows a configuration of a logical operation element according to an embodiment where (A) is a section view and (B) is a plan view.
Figure 1:
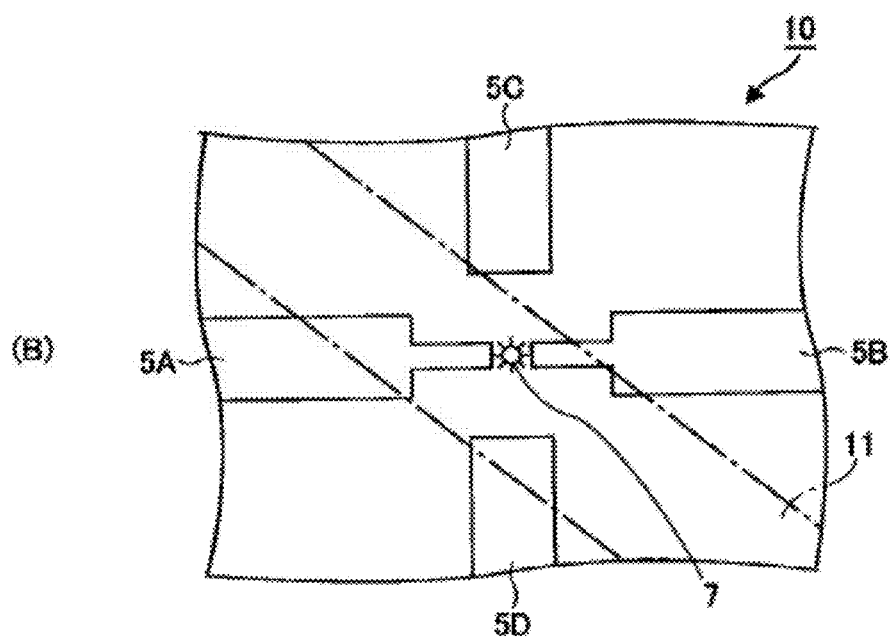

1: Substrate
2: First insulating layer
3A, 3B, 4A, 4B: Metal layer
5A: Nanogap electrode (one electrode)
5B: Nanogap electrode (the other electrode)
5C, 5D: Nanogap electrode (side gate electrode)
6, 6A, 6B: Self-assembled monolayer
7: Metal nanoparticle
7A: Metal nanoparticle protected by alkane thiol
71: Insulating film
72: Metal nanoparticle with insulating film
8: Second insulating layer
9: Mixed self-assembled monolayer layer (mixed SAM layer)
9A: Alkanethiol
10: Logical operation element
11, 11B: Gate electrode (top gate electrode)
11A: Gate electrode (bottom gate electrode)

DESCRIPTION OF EMBODIMENTS

The embodiments of the present invention will hereinafter be described by referring to the drawings. The present invention can be modified in various ways for use within the range of the invention indicated in the scope of the patent claims.

[Structure of Logical Operation Element]

FIG. 1 shows a configuration of a logical operation element according to an embodiment where (A) is a section view and (B) is a plan view. The logical operation element 10 according to an embodiment is provided with one electrode 5A and other electrode 5B provided so as to have a nanogap separation, metal nanoparticle 7 insulated and placed between the one electrode 5A and the other electrode 5B, a plurality of gate electrodes 5C, 5D, 11 for adjusting an electric charge of the metal nanoparticle 7.

The specific embodiment shown in FIG. 1 includes: a substrate 1; a first insulating layer 2 formed on the substrate 1; one electrode 5A and other electrode 5B provided on the first insulating layer 2 so as to have a nanogap separation; self-assembled monolayers 6 provided on the one electrode 5A and the other electrode 5B; a metal nanoparticle 7 adsorbed on the self-assembled monolayers 6 at a position between the one electrode 5A and the other electrode 5B; side gate electrodes 5C, 5D provided in a direction crossing the direction of installation of the one electrode 5A and the other electrode 5B; a second insulating layer 8 provided on the first insulating layer 2, the one electrode 5A, the other electrode 5B, and the side gate electrodes 5C, 5B so as to bury the self-assembled monolayers 6 and the metal nanoparticle 7; and a top gate electrode 11 placed on the second insulating layer 8 at a position directly above the metal nanoparticle 7.

The nanogap separation is several nm, for example, 0.5 nm to 12 nm. Around the metal nanoparticle 7, the self-assembled mixed monolayer formed by reaction between the self-assembled monolayer (SAM) and the organic molecule is adsorbed and provided as an insulating layer. In Embodiment 1, on the first insulating layer 2, gate electrodes 5C and 5D (they can be called side-gate electrodes) are provided in the direction that crosses the array direction of the one electrode 5A and the other electrode 5B, specifically in the perpendicular direction.

Various semiconductor substrates such as a Si substrate are used for the substrate 1. The first insulating layer 2 is formed by $SiO_2$, $Si_3N_4$, $Al_2O_3$, etc. The one electrode 5A and the other electrode 5B are formed by Au, Al, Ag, Cu, etc. The one electrode 5A and the other electrode 5B can also be formed by laying the adhesion layer and the metal layer one by one. The adhesion layer is formed by Ti, Cr, Ni, etc. and the metal layer is formed on the adhesion layer by same or different metals such as Au, Al, Ag Cu and Ni.

Various types of the self-assembled monolayer 6 are used. The self-assembled monolayer 6 includes the first functional group and second functional group. The first functional group is chemically adsorbed to the metal atoms constructing the first electrode 5A or the second electrode 5B. The second functional group is bonded to the first functional group. The first functional group is any one of thiol group, dithiocarbamate group and xanthate group. The second functional group is any one of alkane, alkene, alkane or alkene whose part or whole of hydrogen molecule is replaced by fluorine, amino group, nitro group and amido group.

The metal nanoparticle 7 is a particle with diameter of several nm, and gold, silver, copper, nickel, iron, cobalt, ruthenium, rhodium, palladium, iridium, platinum, etc. are used for this nanoparticle. Around the metal nanoparticle 7, molecules such as alkanethiol that bond with the straight chain of molecules that construct the self-assembled monolayer 6 are bonded. The second insulating layer 6 is formed by inorganic insulator such as SiN, SiO, SiON, $Si_2O_3$, $SiO_2$, $Si_3N_4$, $Al_2O_3$ and MgO. For the inorganic insulator, it is preferable to use one of stoichiometric composition, but an inorganic insulator that has the composition similar to the stoichiometric one can be used.

The top gate electrode 11 is provided on the second insulating layer 8 at a position directly above the metal nanoparticle 7 in a plan view, striding across the one electrode 5A and the other electrode 5B. As shown in FIG. 1 (B), the top gate electrode 11 is installed in a direction different from the direction of installation of the electrodes 5A, 5B on the first insulating layer 2 and the direction of installation of the side gate electrodes 5C, 5D in order not for the top gate electrode 11 and the other electrodes 5A, 5B, 5C, 5D to generate capacities.

In this case, it is only necessary that the metal nanoparticle 7 is laid, insulated from the one electrode 5A and the other electrode 5B by the self-assembled monolayers 6, or by self-assembled mixed layers, and the second insulating layer 8 around the metal nanoparticle 7.

Figure 2:
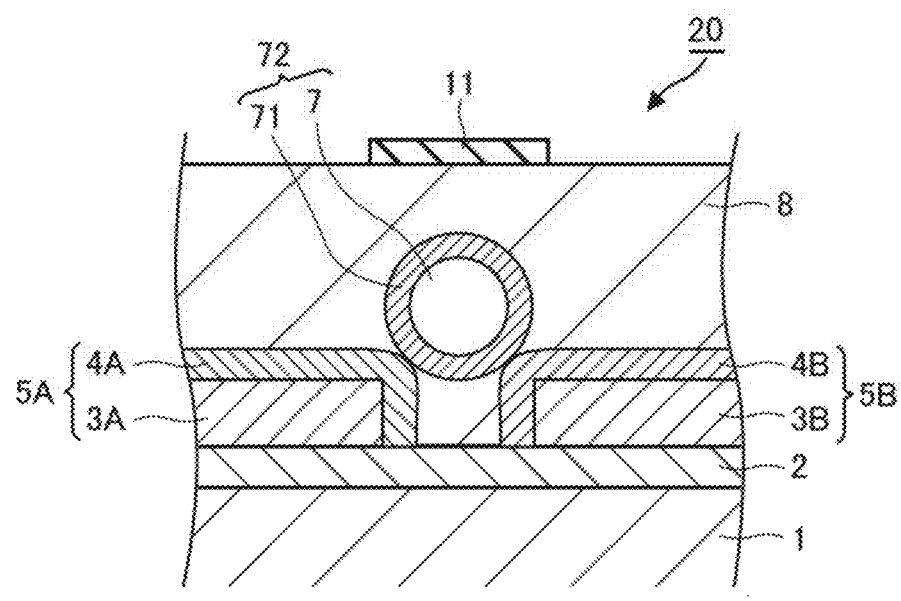
FIG. 2 is a cross-sectional view of a logical operation element that is different from the one shown in FIG. 1.

FIG. 2 is a cross-sectional view of a logical operation element 20 that is different from the one shown in FIG. 1. As shown in FIG. 2, an inorganic or organic insulating film 71 is provided around a metal nanoparticle 7. A metal nanoparticle with an insulating film 72 may be placed between one electrode 5A and other electrode 5B, insulated from the one electrode 5A and the other electrode 5B. It is not necessary that the insulating film 71 is provided over the entire outer peripheral surface of the metal nanoparticle 7. The one electrode 5A and the metal nanoparticle 7 may be insulated by a 0.3 nm to 10 nm insulating film, for example, and the metal nanoparticle 7 and the other electrode 5B may be insulated by a 0.3 nm to 10 nm insulating film, for example. It is also allowed that the metal nanopraticle 7 is positioned between the one electrode 5A and the other electrode 5B and insulated from the one electrode 5A and the other electrode 5B by an insulating layer without distinguishing the insulating film 71 from the second insulating layer 8.

The optimality of the position of the metal nanoparticle 7 is described below. In logical operation elements 10, 20, it is desirable that the metal nanoparticle 7 be placed at a position allowing the gate capacitance between each of the two side gates and the metal nanoparticle and that between the top gate and the metal nanoparticle to become equal. Major factors to achieve that objective include the distance between the metal nanoparticle 7 and each gate electrode 5C, 5D, 11, shape of the nanogap electrodes 5A, 5B, relation between the metal nanoparticle 7 and nanogap length, and the position of the metal nanoparticle 7 between the nanogap electrodes 5A, 5B. Gate capacitance is determined by how much dielectric flux converges on the metal nanoparticle. It is therefore desirable that the nanogap electrodes 5A, 5B have short gap length only at a position where the metal nanoparticle 7 exists, their openings toward the side gate electrodes 5C, 5D are wider, and their openings toward the metal nanoparticle 7, and also toward the top gate electrode 11, are wider. By achieving such a desirable embodiment, the metal nanoparticle 7 is not buried in the gap electrodes 5A, 5B.

[Manufacturing Method for the Logical Operation Element]

Next, detailed explanation is made about the manufacturing method for the logical operation element shown in FIG. 1.

First of all, the first insulating layer 2 is formed on the substrate 1. Subsequently, the nanogap electrodes 5A and 5B and the side-gate electrodes 5C and 5D are formed by molecular-ruler electroless plating.

For example, the metal layers 3A and 3B are placed separated in a pair on the first insulating layer 2 so that the gap between these two is wider than the nanogap, and then the substrate 1 is immersed into electroless plating solution. The electroless plating solution is produced by mixing reducing agent and surface acting agent with electrolytic solution that contains metallic ions. When the substrate 1 is immersed into this electroless plating solution, metallic ions are reduced by the reducing agent, metal is deposited on the surface of the metal layers 3A and 3B, forming the metal layers 4A and 4B and narrowing the gap between the metal layer 4A and the metal layer 4B, and the surface acting agent contained in the electroless plating solution is chemically adsorbed to the metal layers 4A and 4B formed by deposition. The surface acting agent controls the gap separation (simply called "gap separation") in nanometer size. This method is classified as electroless plating because the metal ions in the electrolytic solution are reduced by the reducing agent and the metal is deposited. The metal layers 4A and 4B are formed on the metal layers 3A and 3B by plating, producing a pair of the electrodes 5A and 5B. Thus, using the electroless plating (hereafter referred to as "molecular-ruler electroless plating") that uses the surface acting agent molecules, which are the protecting group, as the molecular ruler for the surface of the nanogap electrodes 5A and 5B, the gap separation is controlled by the molecules of the surface acting agent. Accordingly, the nanogap electrodes 5A and 5B can be formed in high accuracy. The gate electrodes 5C and 5D can also be formed at the same time. The nanogap electrodes are not limited to those formed by the above method. As disclosed in Non-patent Literature 3 by the inventor et al., for example, the nanogap electrodes may be formed by electroless plating using iodine.

Subsequently, ligand exchange of the gold nanoparticle 7 protected by alkanethiol by dithiol molecule is used to chemically bond the metal nanoparticle 7 between the nanogap electrodes 5A and 5B. Thus, the metal nanoparticle 7 is fixed on, for example, the self-assembled monolayer 6.

Figure 3:
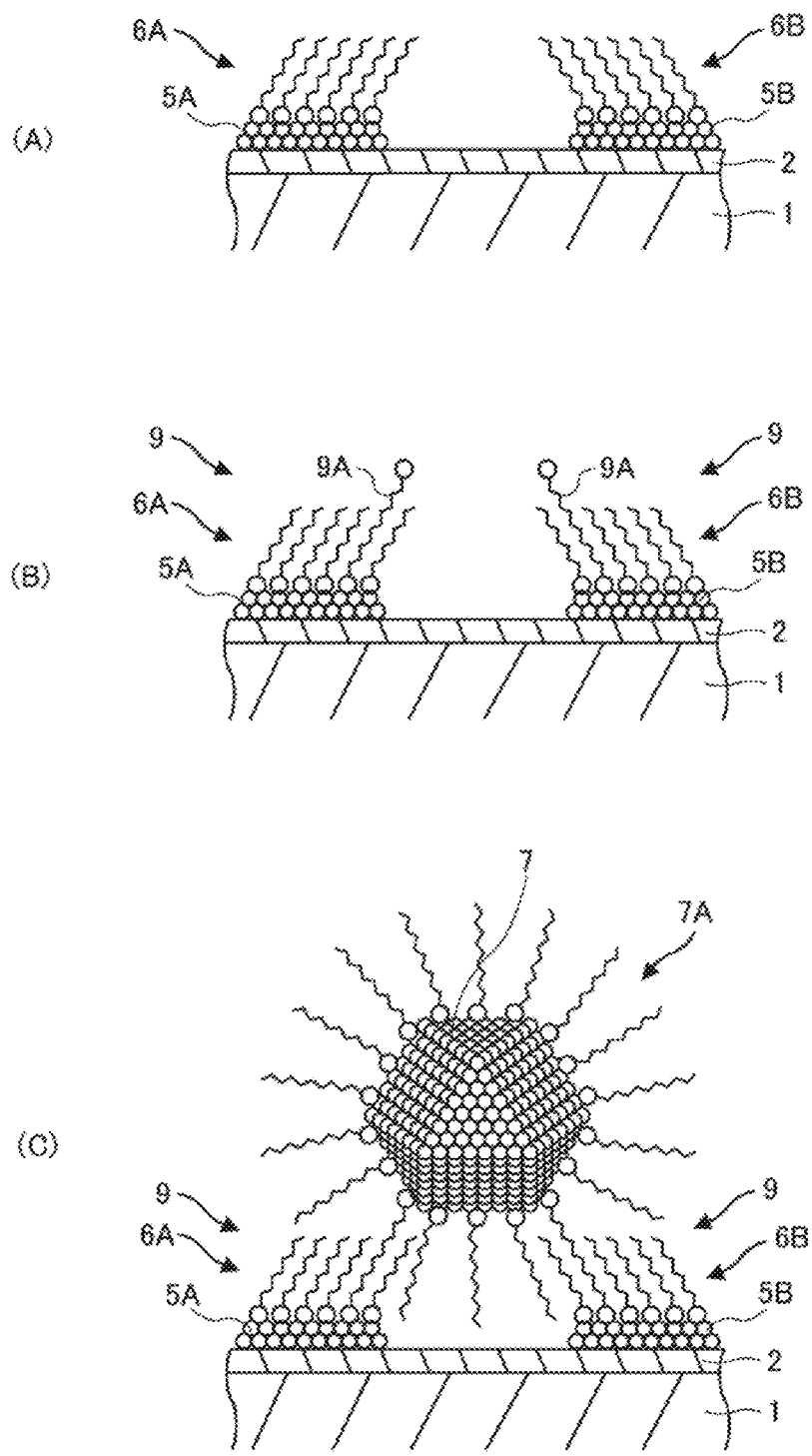
FIG. 3 is configuration schematically showing an installation process of single electron island for the electrodes which has the nanogap separation, in chemical bonding by using, for example, dithiol molecules.

FIG. 3 is configuration schematically showing an installation process of single electron island for the electrodes 5A and 5B, which has the nanogap separation, in chemical bonding by using, for example, dithiol molecules. As shown in FIG. 3 (A), self-assembled monolayers (SAMs) 6A and 6B are formed on the surface of metal electrodes 5A and 5B. Subsequently, as shown in FIG. 3 (B), alkanedithiol 9A is introduced to place alkanedithiol on the defective SAM part or exchange is performed between alkanethiol and alkanedithiol, and so the mixed SAM layer 9 is formed as an insulating layer that comprises SAM and alkanethiol. Subsequently, the metal nanoparticle 7A protected by alkanethiol is introduced. Then, as shown in FIG. 3 (C), the metal nanoparticle 7 is chemically adsorbed to the self-assembled monolayer by ligand exchange between the alkanethiol, which is the protecting group of the metal nanoparticle 7, and the alkanedithiol contained in the mixed self-assembled monolayers 6A and 6B, which comprise alkanethiol and alkanedithiol.

Thus, using the self-assembled monolayers 6A and 6B and placing the mixed SAM layer in between, the metal nanoparticle 7 is installed as a single electron island between the electrodes 5A and 5B, which have the nanogap separation, by chemical adsorption.

Subsequently, by using the catalytic CVD, plasma CVD, photo CVD or pulsed laser deposition (PLD), the second insulating layer 8 is deposited on the sample while the substrate with the nanogap electrodes, to which the metal nanoparticle 7 is chemically adsorbed by the self-assembled monolayers 6A and 6B, is cooled so that sample is not heated above the specified temperature.

In addition, when depositing $Al_2O_3$ or $Si_3N_4$, as the second insulating layer 8, atomic layer epitaxy or thermal CVD can be used to pyrolyze gas. In that case, it is necessary to sufficiently cool the sample base.

A resist is then applied, a pattern of the gate electrode 11 is drawn by electron beam lithography or optical lithography, and after performing development, one type or two types of metal layers are formed, thereby forming the gate electrode 11. In this case, it is preferable that an adhesion layer is formed.

To establish external connection of the nanogap electrodes 5A, 5B at the same time or in tandem with the formation of the gate electrode 11, electrodes for external extraction are formed. For example, by forming a resist on the second insulating layer 8, and placing a mask on the resist and exposing it to light, a mask pattern is formed on the resist. Then, a via hole is formed on the second insulating layer 8. The self-assembled molecule in the via-hole is removed by ashing as needed. The via hole is filled with metal to form an electrode for external extraction.

In the above, gold is used for electrode material, but other metal can be used, not limited to gold. For example, copper can be used as electrode material for the initial electrode. At that time, for the initial electrode, copper electrode is formed by using electron beam lithography or optical lithography and then the copper electrode surface is made to be copper chloride. For plating solution, gold chloride solution that contains ascorbic acid as reducing agent is used to cover the copper electrode surface with gold. Specifically, aqueous solution of gold chloride (III) acid is mixed with surface acting agent of alkyl bromide trimethylammonium $C_nH_{2n+1}[CH_3]_3N^+.Br^-$, reducing agent L (+)-ascorbic acid is added, and autocatalytic electroless gold plating is performed on the gap electrode. Subsequently, using the molecular ruler plating method, nanogap electrodes, whose surface is gold, are produced.

Thus, it is possible to prepare the logical operation element 10 according to the embodiment of the present invention.

Here, difficulty in conventionally placing the top gate electrode 11 will be described. The difficulty relies on the infeasibility of forming the second insulating layer 8 in the production of single-electron devices.

When forming an inorganic insulating layer such as $Si_3N_4$ by using the catalytic CVD, plasma CVD, photo CVD or PLD, generally, samples may be exposed in plasma, or be spattered with particles with high kinetic energy and the substrate temperature became high mainly to improve the layer quality. Single electron devices were easily destroyed by plasma, high energy particles, heat, etc. applied to these substrates. So it was difficult to deposit inorganic insulating layer.

Namely, when an inorganic insulating layer is deposited on the nanoparticle, the surface of which is covered by an organic substance such as self-assembled monolayer (SAM), or on the nanoparticle, the surface of which is covered by ligand molecule, the layer source destroys the SAM and the ligand molecule, and the nanoparticle is destroyed and so the element is destroyed. Even if the element is not destroyed, the nanoparticle existing in the gap moves into the deposited inorganic insulator and then the element cannot function as a single electron element. Especially the metal electrode of the nanoscale used as a metal nanogap electrode has high fluidity when heat is applied, and so the nanogap structure changes and the single electron element is destroyed when heat is applied.

However, researching intensively and focusing on the following viewpoints, the inventors completed the formation of the second insulating layer 8, etc.

1) An electrode couple can be formed while controlling the gap separation by using electroless plating, and the nanogap is stable against heat.
2) When depositing inorganic insulator, the electrode surface is not destroyed because the metal nanoparticle is covered by the coordinated molecule and the nanogap electrode is covered by the SAM.
3) The metal nanoparticles, which function as a single electron island (also called Coulomb island), are fixed chemically within the nanogap by anchor molecule, for example, dithiol molecule.

[Operation of the Logical Operation Element]

Figure 4:
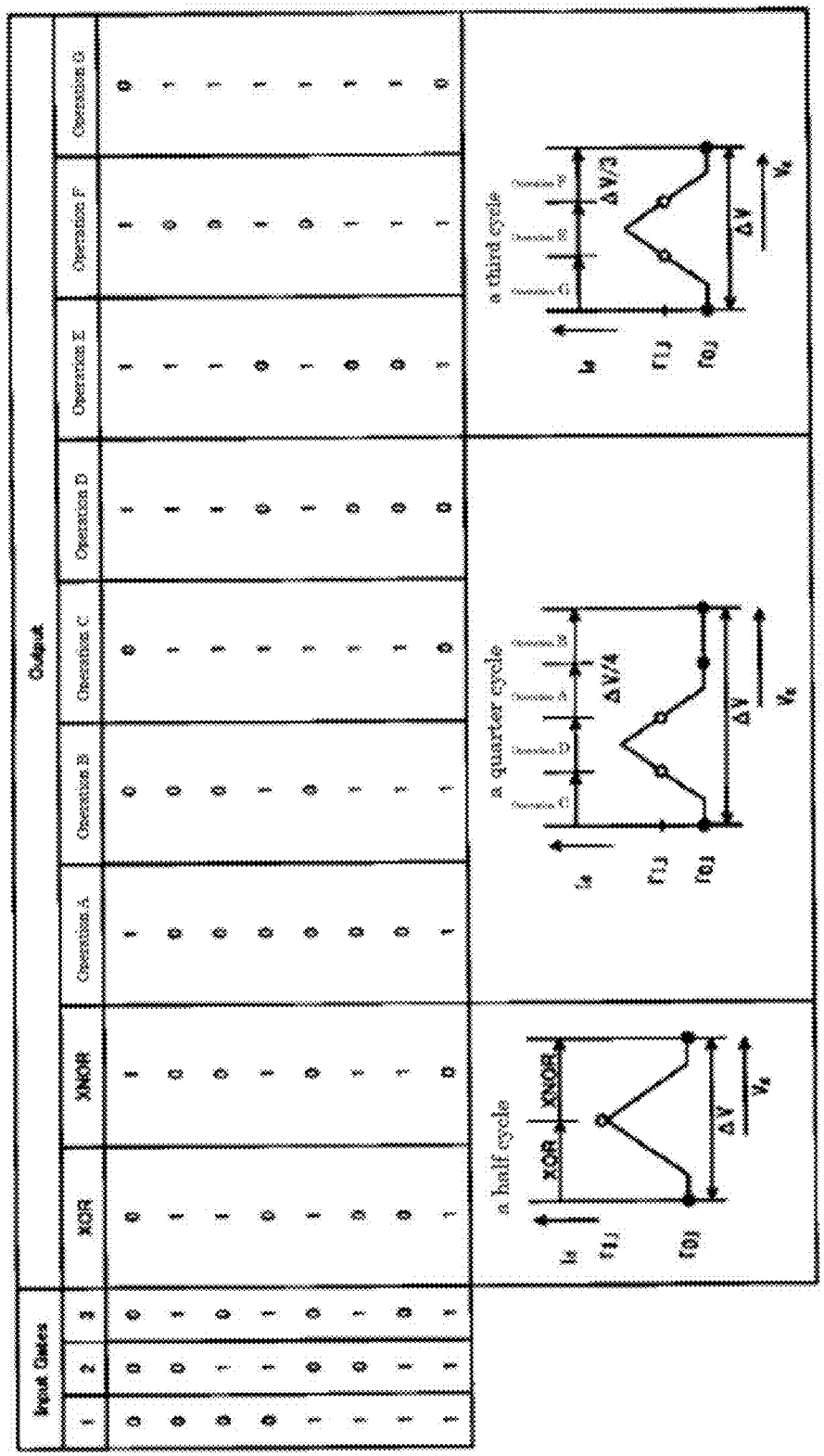
FIG. 4 is a chart showing a three-input truth table along with a method of setting a gate voltage to allow each logical operation to be performed.
Figure 5:
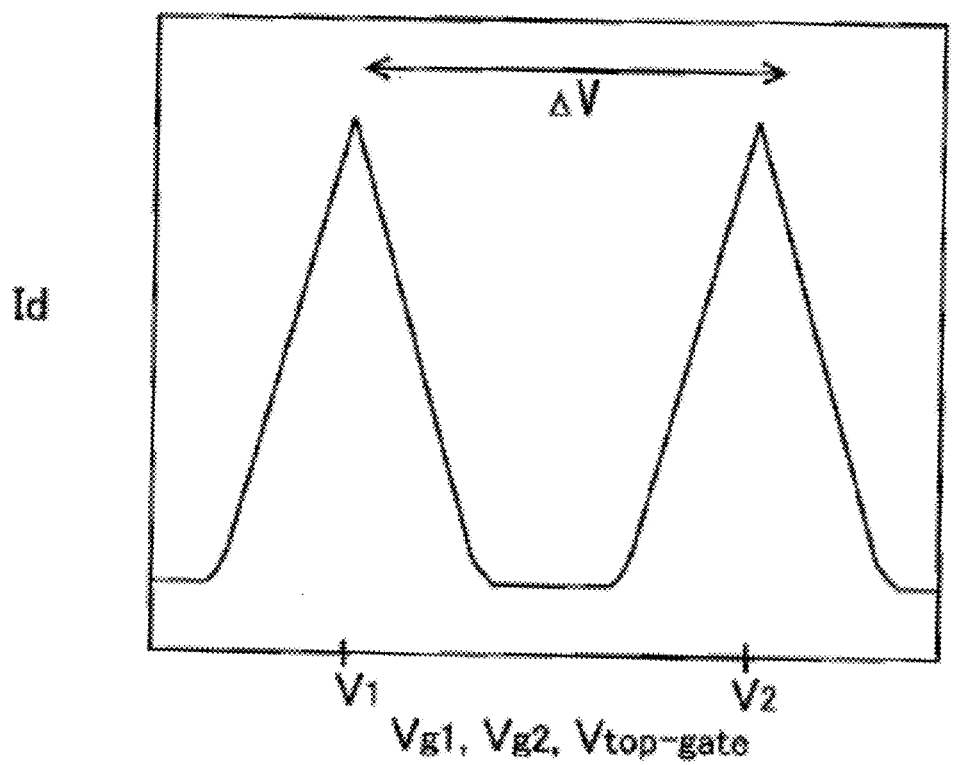
FIG. 5 is a chart schematically showing the waveform of drain current fed in response to each gate voltage at a certain drain voltage.
Figure 6:
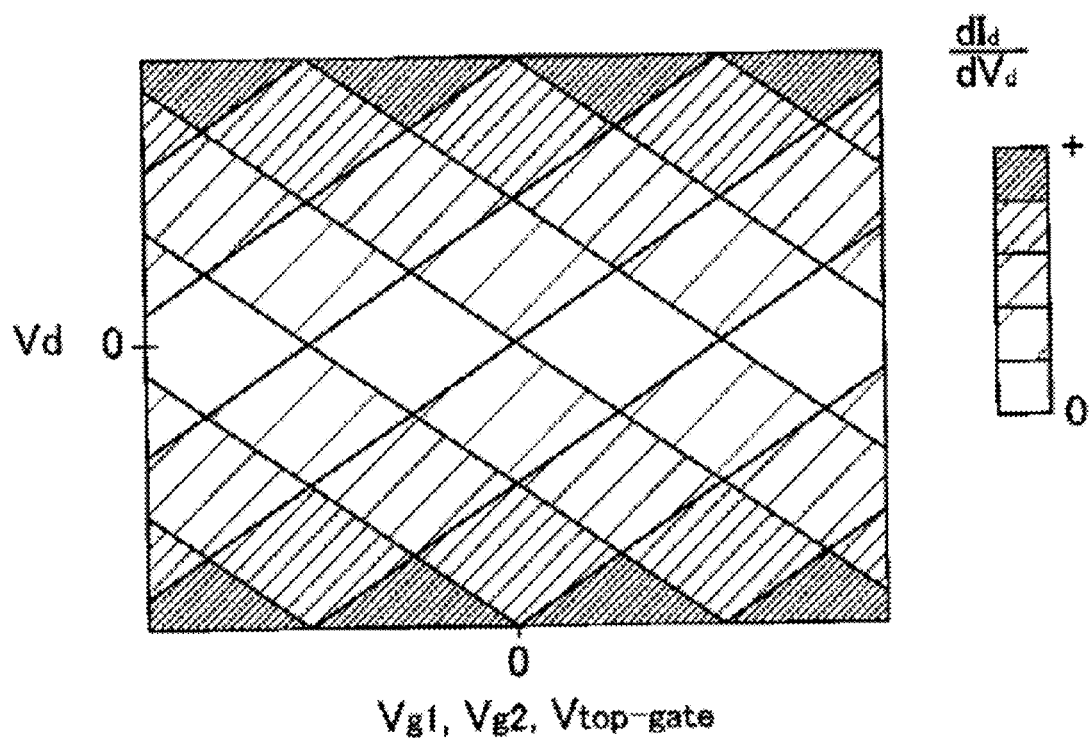
FIG. 6 is a chart schematically showing differential conductance obtained when drain voltage $V_d$ and each gate voltage $V_{g1}$, $V_{g2}$, $V_{top\text{-}gate}$ are set at respective values.

The principle of operation of a logical operation element according to an embodiment of the present invention will hereinafter be described. FIG. 4 is a chart showing a three-input truth table along with a method of setting a gate voltage to allow each logical operation to be performed. The logical operation element according to the embodiment of the present invention has a single electron transistor structure. Despite that the single electron transistor is a type of field effect transistors (FET), the charge to a single electron island, which is a metal nanoparticle 7, is modulated by the gate voltage. As a result, a state where current is fed and a state where current is not fed appear periodically, which is so-called a Coulomb oscillation phenomenon. FIG. 5 schematically shows the waveform of drain current fed in response to each gate voltage at a certain drain voltage. FIG. 6 is a chart schematically showing differential conductance of drain current I obtained when drain voltage $V_d$ and each gate voltage $V_{g1}$, $V_{g2}$, $V_{top\text{-}gate}$ are set at respective values. In FIG. 6, the magnitude of the differential conductance of drain current I increases with the increase in the number of meshes. As shown in FIG. 5, the current waveform in Coulomb oscillation characteristics is extrapolated by straight lines having positive and negative inclinations in two voltage directions, drain voltage $V_d$ and each gate voltage, and the current value has peaks.

As shown in FIG. 5, a difference between gate voltage V1 producing peak current and gate voltage V2 producing peak current at immediate right $\Delta V$ (=V2−V1) is equivalent to a cycle of Coulomb oscillation, and the gate capacity C is given by C=e/$\Delta V$, where e represents elementary electric charge. This $\Delta V$ value depends on the positional relation between the metal nanoparticle 7 and one electrode 5A and other electrode 5B, namely the positional relation between the metal nanoparticle 7 and a source electrode and a drain electrode, and furthermore on the positional relation between two side gate electrodes 5C, 5D and a top gate electrode 11. In other words, since the $\Delta V$ value depends on the layout of the three gate electrodes 5C, 5D, 11, each of the three gate electrodes has its own $\Delta V$ value corresponding to the Coulomb oscillation for one cycle of the drain current $I_d$.

To allow logical operation elements 10, 20 having three gate electrodes to perform exclusive-OR (XOR) operation, the value of each gate electrode should be set as follows. In the XOR operation, drain voltage is adjusted so that the difference in voltages applied to the three gates, namely the difference between a voltage corresponding to "0" input and a voltage corresponding to "1" input, becomes voltage difference equivalent to $\Delta V/2$ (half cycle). And the top gate voltage corresponding to "1" input is set at a gate voltage producing peak current of Coulomb oscillation, and the gate voltage corresponding to "0" input is set at a voltage value smaller by $\Delta V/2$. The top gate voltage is set at "0" input determined previously. Then, regarding one side gate voltage, a side gate voltage producing a peak current is set at a gate voltage corresponding to "1" input, and the gate voltage corresponding to "0" input is set at a voltage value smaller by $\Delta V/2$. The top gate voltage and one side gate voltage are set at "0" input. Furthermore, regarding the other side gate voltage, the gate voltage producing peak current is set at a gate voltage corresponding to "1" input and the gate voltage corresponding to "0" input is set at a voltage value smaller by $\Delta V/2$. In this case, the input gate voltage is set so that all the three gate voltages are those corresponding to "1" input and have a current peak value whose output is "1".

When all the three gate voltages are set at "0", current is not fed and output remains "0".

When the gate voltage of one of the three gate electrodes is set at "1" and the gate voltage of the remaining two gate electrodes is set at "0", peak current is fed, and the output becomes "1".

When the gate voltage of any two of the three gate electrodes is set at "1" and the gate voltage of the remaining one is set at "0", superposition inducing electric charge to a single-electron island by the gate voltage occurs, developing a state where $\Delta V$ for one cycle is applied, and as a result, the output becomes "0".

Since setting all the three gate voltages at "1" is equivalent to the application of $\Delta V$ for 1.5 cycles, the output becomes "1".

The column of XOR in the truth table of FIG. 4 exhibits the result of output current described above. "0" in the output result represents the state where the current is not fed or small, whereas "1" represents the state where current is fed or large.

In the columns at the bottom of the truth table, Coulomb oscillation for one cycle (the horizontal axis represents gate voltage, and the vertical axis represents drain current) is shown, where a black circle (●) represents "0" current output state, and a white circle (○) represents "1" current output state. XOR operation uses the electric potential difference of $\Delta V/2$ as the electric potential difference of input gate voltages equivalent to "0" and "1". Since the output remains "0" when the input is "0", the voltage region on the left half of Coulomb oscillation for one cycle is used as the voltage applied to each gate voltage.

As described above, the relation between the combination of inputs into the gate electrodes and the output determines the output of exclusive OR (XOR). Consequently, with a single electron transistor, logical operation can be achieved based on the Coulomb oscillation characteristics and superposition phenomenon inducing electric charge to a single electron island by a plurality of gate electrodes.

A case where logical operation elements 10, 20 are made to negate exclusive OR (XNOR: exclusive not OR) will then described. In this case, it is only necessary to set each gate voltage value as follows. Specifically, in XNOR operation, drain voltage is adjusted so that the difference in input voltage between the state of "0" and "1" becomes the difference in gate voltage equivalent to $\Delta V/2$ as in the case of XOR. The gate voltage of the input is set so that the output takes a current peak value with "1" output when all the three gate voltages are those corresponding to "0" input. Consequently, based on the operation principle as in the case of XOR, XNOR logical operation can be achieved with this gate voltage setting, meaning that the voltage region on the right half of the Coulomb oscillation drawing for one cycle is used as the voltage applied to each gate voltage.

Then, two gate voltages having voltage difference of $\Delta V/4$ are applied to the logical operation elements 10, 20 by using $\Delta V/4$ (quarter cycle) as the voltage difference between "0" input and "1" input, and the drain voltage is adjusted so that the intermediate value on the positive slope before the peak current of Coulomb oscillation and that on the negative slope after the peak exhibit the same current value. As shown in the quarter-cycle Coulomb oscillation characteristics in FIG. 4, if the gate voltage is changed per $\Delta V/4$, the voltage changes as follows: "0", "1", "1", "0".

A case where operation A or operation C is performed will be described. In this case, it is only necessary that the input voltage value of each gate voltage is set at a gate voltage equivalent to operation A of quarter-cycle Coulomb oscillation in FIG. 4. Specifically, the drain voltage is adjusted so that the value obtained by equally dividing $\Delta V$ into four appears as the same current value on the positive and negative slopes of the peak current of Coulomb oscillation, the top gate voltage corresponding to "0" input is set to a voltage value on the negative slope of the peak current, and the top gate voltage corresponding to "1" input is set to a voltage value higher than the set voltage by $\Delta V/4$.

Then, to set one side gate voltage, the top gate voltage is set at "0" input determined previously, one side gate voltage value corresponding to "0" input is set at a voltage value on the negative slope of the peak current so that the value obtained by equally dividing Δ V into four appears as the same current value on the positive and negative slopes of the peak current of Coulomb oscillation, and the top gate voltage corresponding to "1" input is set at a voltage value higher than the set voltage value by Δ V/4.

Furthermore, to set the other side gate voltage, the top gate voltage and one side gate voltage are set at "0" input, the other side gate voltage value corresponding to "0" input is set to the voltage value on the negative slope of the peak current so that the value obtained by equally dividing Δ V into four appears as the same current value on the positive and negative slopes of the peak current of Coulomb oscillation, and the top gate voltage corresponding to "1" input is set to a voltage value higher than the set voltage value by Δ V/4.

The gate voltage of the input is set so that all the three gate voltages are those corresponding to "1" input and have a current peak value of "1" output. Then the output becomes "1" only when the input into the three gate voltages is (0, 0, 0) and (1, 1, 1). In other cases, the output becomes "0" and the logical operation element 10 performs operation A.

Reversely, the gate voltage equivalent to operation C is set as follows. Specifically, the top gate voltage corresponding to "1" input is set at a voltage value on the positive slope of the peak current so that the value obtained by equally dividing Δ V into four appears as the same current value on the positive and negative slopes of the peak current of Coulomb oscillation, and the top gate voltage corresponding to "0" input is set at a voltage value lower than the set voltage by Δ V/4.

Then, to set one side gate voltage, the top gate voltage is set at "0" input determined previously, one side gate voltage value corresponding to "1" input is set at a voltage value on the positive slope of the peak current so that the value obtained by equally dividing Δ V into four appears as the same current value on the positive and negative slopes of the peak current of Coulomb oscillation, and the top gate voltage corresponding to "0" input is set at a voltage value lower than the set voltage by Δ V/4.

Furthermore, to set the other side gate voltage, the top gate voltage and one side gate voltage are set at "0" input, the other side gate voltage value corresponding to "1" input is set at a voltage value on the positive slope of the peak current so that the value obtained by equally dividing Δ V into four appears as the same current value on the positive and negative slopes of the peak current of Coulomb oscillation, and the top gate voltage corresponding to "0" input is set at a voltage value lower than the set voltage by Δ V/4.

Then, the output becomes "0" only when the input to all the three gate voltages is (0, 0, 0) and (1, 1, 1), and in other cases, the output becomes "1" and logical operation of operation C is performed.

A case where the logical operation element 10 is made to perform operation B or operation D will then be described. In this case also, drain voltage is adjusted by using Δ V/4 as a voltage difference between "0" input and "1" input so that intermediate values on the positive and negative slopes of the peak current exhibit the same value. The gate voltage corresponding to operation B is set as follows.

For example, the top gate voltage corresponding to "1" input is set at a value higher than the voltage value on the positive slope of the peak current by ¾ times Δ V so that the value obtained by equally dividing Δ V into four appears as the same current value on the positive and negative slopes of the peak current of Coulomb oscillation, and the top gate voltage corresponding to "0" input is set at a voltage value lower than the set voltage by Δ V/4.

Next, to set one side gate voltage, the top gate voltage is set at "0" input determined previously, one side gate voltage value corresponding to "1" input is set at a value higher than the voltage value on the positive slope of the peak current by ¾ times Δ V so that the value obtained by equally dividing Δ V into four appears as the same current value on the positive and negative slopes of the peak current of Coulomb oscillation, and the top gate voltage corresponding to "0" input is set to a value lower than the set voltage value by Δ V/4.

Furthermore, to set the other side gate voltage, the top gate voltage and one side gate voltage are set to "0" input, the other side gate voltage value corresponding to "1" input is set at a voltage value higher than the voltage value on the positive slope of the peak current by ¾ times Δ V so that the value obtained by equally dividing Δ V into four appears as the same current value on the positive and negative slopes of the peak current of Coulomb oscillation, and the top gate voltage corresponding to "0" input is set at a voltage value lower than the set voltage by Δ V/4.

Then the output becomes "0" when the number of "0" input is 0 or 1, and in other cases the output becomes "1" and logical operation B is performed.

Reversely, the gate voltage corresponding to operation D is set as follows. For example, the top gate voltage corresponding to "0" input is set at a voltage value on the positive slope of the peak current so that the value obtained by equally dividing Δ V into four appears as the same current value on the positive and negative slopes of the peak current of Coulomb oscillation, and the top gate voltage corresponding to "1" input is set at a voltage value higher than the set voltage value by Δ V/4. When "1" is input, the same current value described previously appears on the negative slope.

Then, to set one side gate voltage, the top gate voltage is set at "0" input determined previously, one side gate voltage value corresponding to "0" input is set at a voltage value on the positive slope of the peak current so that the value obtained by equally dividing Δ V into four appears as the same current value on the positive and negative slopes of the peak current of Coulomb oscillation, and the top gate voltage corresponding to "1" input is set at a voltage value higher than the set voltage by Δ V/4.

Furthermore, to set the other side gate voltage, the top gate voltage and one side gate voltage are set at "0" input, the other side gate voltage value corresponding to "0" input is set at a voltage value on the positive slope of the peak current so that the value obtained by equally dividing Δ V into four appears as the same current value on the positive and negative slopes of the peak current of Coulomb oscillation, and the top gate voltage corresponding to "1" input is set at a voltage value higher than the set voltage value by Δ V/4.

Then the output becomes "1" when the number of "0" input is 0 or 1, and in other cases the output becomes "0" and logical operation D is performed.

The logical operation element 10 can also be made to perform the following operation: by using Δ V/3 as a voltage difference between "0" input and "1" input, the drain voltage is adjusted so that intermediate values on the positive and negative slopes before and after the current peak of Coulomb oscillation exhibit the same current value when two gate voltages having a voltage difference of Δ V/3 are applied.

The gate voltage corresponding to operation E is set as follows. For example, the top gate voltage corresponding to "0" input is set at a voltage value on the positive slope of the peak current so that the value obtained by equally dividing $\Delta$ V into three appears as the same current value on the positive and negative slopes of the peak current of Coulomb oscillation, and the top gate voltage corresponding to "1" input is set at a voltage value higher than the set voltage value by $\Delta$ V/3.

Then, to set one side gate voltage, the top gate voltage is set at "0" input determined previously, one side gate voltage value corresponding to "0" input is set at a voltage value on the positive slope of the peak current so that the value obtained by equally dividing $\Delta$ V into three appears as the same current value on the positive and negative slopes of the peak current of Coulomb oscillation, and the top gate voltage corresponding to "1" input is set at a voltage value higher than the set voltage value by $\Delta$ V/3.

Furthermore, to set the other side gate voltage, the top gate voltage and one side gate voltage are set at "0" input, the other side gate voltage corresponding to "0" input is set at a voltage value on the positive slope of the peak current so that the value obtained by equally dividing $\Delta$ V into three appears as the same current value on the positive and negative slopes of the peak current of Coulomb oscillation, and the top gate voltage corresponding to "1" input is set at a voltage value higher than the set voltage value by $\Delta$ V/3.

Logical operation E, where the output becomes "0" only when the number of "1" input is two and the output becomes "1" in other cases, can thus be achieved.

Reversely, the gate voltage corresponding to operation F is set as follows. For example, the top gate voltage corresponding to "0" input is set at a voltage value on the negative slope of the peak current so that the value obtained by equally dividing $\Delta$ V into three appears as the same current value on the positive and negative slopes of the peak current of Coulomb oscillation, and the top gate voltage corresponding to "1" input is set at a voltage value higher than the set voltage value by $\Delta$ V/3.

Then, to set one side gate voltage, the top gate voltage is set at "0" input determined previously, one side gate voltage value corresponding to "0" input is set at a voltage value on the negative slope of the peak current so that the value obtained by equally dividing $\Delta$ V into three appears as the same current value on the positive and negative slopes of the peak current of Coulomb oscillation, and the top gate voltage corresponding to "1" input is set at a voltage value higher than the set voltage value by $\Delta$ V/3.

Furthermore, to set the other side gate voltage, the top gate voltage and one side gate voltage are set at "0" input, the other side gate voltage value corresponding to "0" input is set at a voltage value on the negative slope of the peak current so that the value obtained by equally dividing $\Delta$ V into three appears as the same current value on the positive and negative slopes of the peak current of Coulomb oscillation, and the top gate voltage corresponding to "1" input is set at a voltage value higher than the set voltage value by $\Delta$ V/3.

Logical operation of operation E, where the output becomes "0" only when the number of "1" input is one and the output becomes "1" in other cases, can thus be achieved.

The gate voltage corresponding to operation G is set as follows. For example, the top gate voltage corresponding to "1" input is set as follows: $\Delta$ V is equally divided into three so that the value obtained by equally dividing $\Delta$ V into three appears as the same value on the positive and negative slopes of the peak current of Coulomb oscillation, and the obtained value is regarded as a value on the positive slope of the peak current. The top gate voltage corresponding to "0" input is set at a voltage value lower than the set value by $\Delta$ V/3.

Then, to set one side gate voltage, the top gate voltage is set at "0" input determined previously, and one side gate voltage value corresponding to "1" input is set as follows: $\Delta$ V is equally divided into three so that the value obtained by equally dividing $\Delta$ V into three appears as the same value on the positive and negative slopes of the peak current of Coulomb oscillation, and the obtained value is regarded as a value on the positive slope of the peak current. The top gate voltage corresponding to "0" input is set at a voltage value lower than the set value by $\Delta$ V/3.

Furthermore, to set the other side gate voltage, the top gate voltage and one side gate voltage are set at "0" input, and the other gate voltage value corresponding to "1" input is set as follows: $\Delta$ V is equally divided into three so that the value obtained by equally dividing $\Delta$ V into three appears as the same value on the positive and negative slopes of the peak current of Coulomb oscillation, and the obtained value is regarded as a value on the positive slope of the peak current. The top gate voltage corresponding to "0" input is set at a voltage value lower than the set value by $\Delta$ V/3.

Logical operation of operation G, where the output becomes "1" only when the number of "1" input is one or two and the output becomes "0" in other cases, can thus be achieved.

As described above, the logical operation elements 10, 20 shown in FIGS. 1 and 2 can achieve three-input logical operation by regarding the voltage difference between High and Low, the voltage difference between "0" and "1" for example, as $\Delta$ V/n, and setting each integer of 2 or higher for n.

In this case, if leak current is fed from side gate electrodes 5C, 5D to the one electrode 5A and the other electrode 5B, which respectively function as source and drain electrodes, the On/Off ratio decreases, which is undesirable. It is therefore necessary to increase the gap length to prevent leak current from being fed.

The number of gate electrodes in the embodiment of the present invention need not to be three as shown in FIG. 1: four or more gate electrodes are allowed. Gate electrodes are classified into a bottom gate electrode, top gate electrode, and side gate electrode in accordance with their position of arrangement. Any materials can be used for each electrode, provided that a specified voltage can be applied.

Three or more gate electrodes may be made up of two side gate electrodes and one top gate electrode. Three or more gate electrodes may also be made up of two side gate electrodes and one bottom gate electrode. Three or more gate electrodes may also be made up of two side gate electrodes, one top gate electrode, and one bottom gate electrode.

Of the three or more gate electrodes, four gate electrodes, namely two side gate electrodes, one bottom gate electrode, and one top gate electrode for example, any arbitrary three electrodes may be used for voltage input, and the remaining one may be used as an electrode for voltage adjustment. As described by referring to FIG. 1, etc., since two side gate electrodes are symmetrical with respect to the axis of arrangement of the one electrode and the other electrode, it is desirable that either the bottom gate electrode or the top gate electrode be used as an electrode for voltage adjustment. The electrode for voltage adjustment is set at 0 V for example, and with reference to it, the voltage value to be applied to other gate electrodes can be set.

[Four-Input Logical Operation Element]

Figure 7:
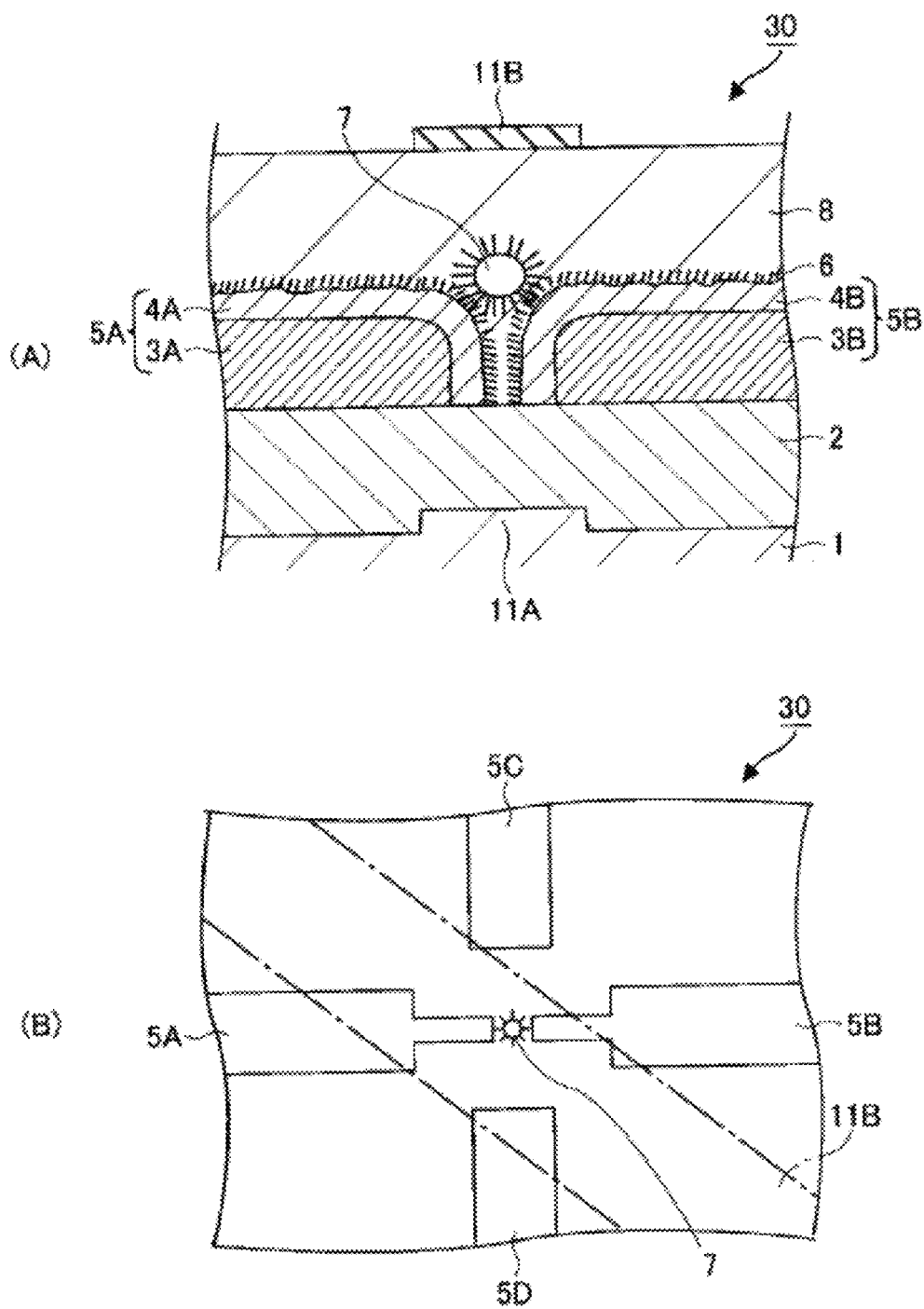
FIG. 7 shows an configuration of a logical operation element according to an embodiment, where (A) is a cross-sectional view and (B) is a plan view.

A four-input logical operation element will then be described. FIG. 7 shows an configuration of a four-input logical operation element according to an embodiment, where (A) is a cross-sectional view and (B) is a plan view. As shown in FIG. 7, the logical operation element 30 according to an embodiment of the present invention includes: one electrode 5A and other electrode 5B provided so as to have a nanogap; a metal nanoparticle 7 placed between the one electrode 5A and the other electrode 5B in insulated state; and a plurality of gate electrodes 5C, 5D, 11A, 11B for adjusting an electric charge of the metal nanoparticle 7.

A face where a bottom gate electrode 11A exists, a face where side gate electrodes 5C, 5D exist, and a face where a top gate electrode 11B exists are separated from one another in the vertical direction. The face where the bottom gate electrode 11A exists and the face where the top gate electrode 11B exists are arranged one above the other and away from each other, sandwiching the face where the side gate electrodes 5C, 5D exist. The metal nanoparticle 7 is embedded in a second insulating layer 8 at a position above the bottom gate electrode 11A and beneath the top gate electrode 11B.

In the embodiment shown in FIG. 7, a conductive substrate 1 such as a Si substrate is formed into a shape where a specified area only is higher than other areas by allowing the substrate 1 to undergo treatment such as etching. A first insulating layer 2 is formed on the substrate 1, and its surface is made flat as required. Then, as in the case of the logical operation element 10 in FIG. 1, one electrode 5A and other electrode 5B are formed, a metal nanoparticle 7 is placed in nanogap above the specified area, a second insulating layer 8 is formed, and a top gate electrode 11B is formed.

By applying a voltage to the substrate 1, the protruding part of the substrate 1 is thus allowed to function as a bottom gate electrode 11A.

Note that by replacing a part of the substrate 1 with a conductive layer, a plurality of logical operation elements can be integrated, and also a logical operation element using a metal nanoparticle can be integrated with another or other two or more elements.

[Operation of Four-Input Logical Operation Element]

Figure 8:
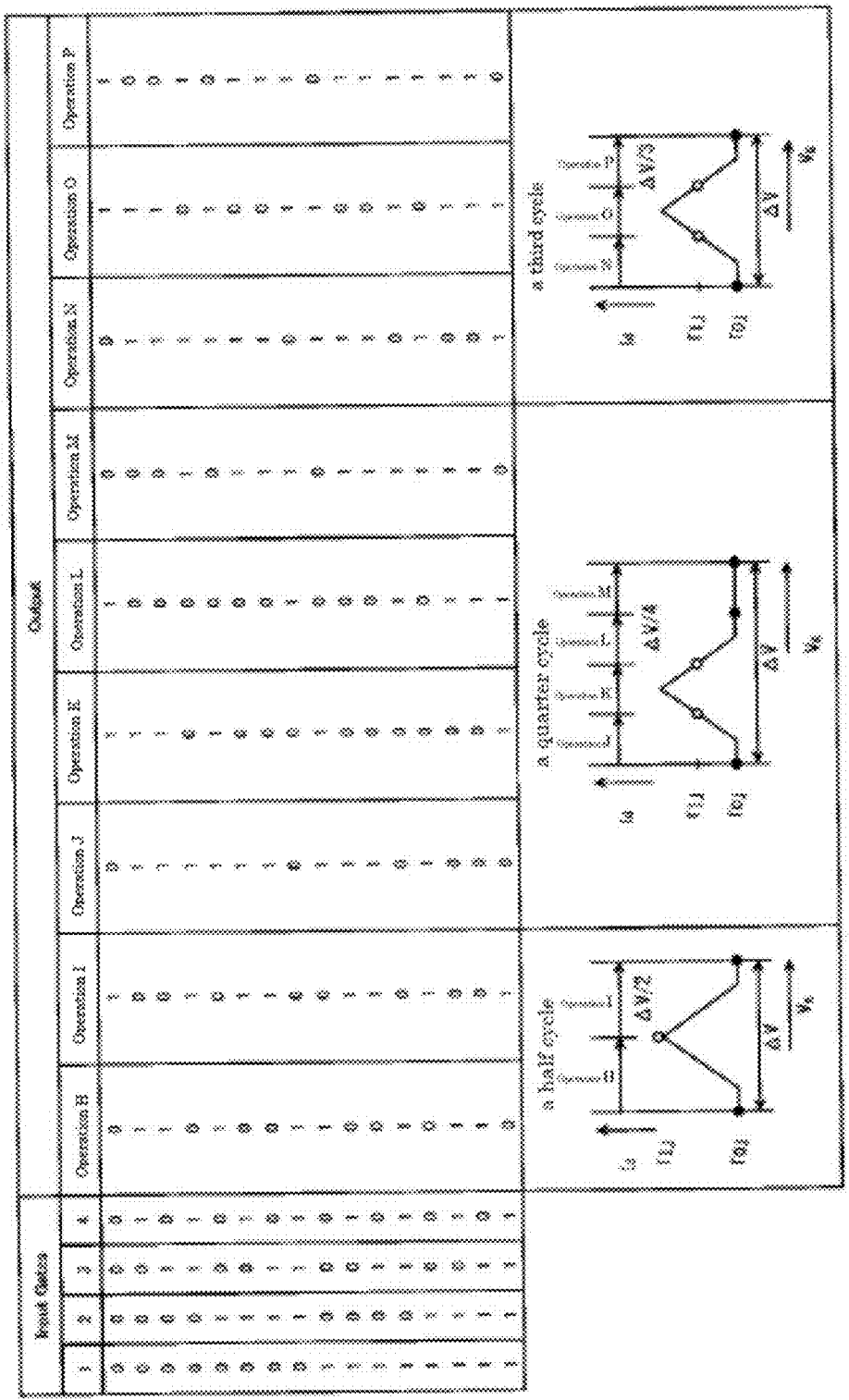
FIG. 8 is a table showing four-input truth table and the method of setting gate voltage to allow each logical operation to be performed.

FIG. 8 is a table showing four-input truth table and the method of setting gate voltage to allow each logical operation to be performed.

In operations H and I, by using a voltage difference of Δ V/2 (half cycle) between "0" input and "1" input, drain voltage is adjusted so that the peak current of Coulomb oscillation is exhibited when two gate voltages having voltage difference of Δ V/2 are applied to the logical operation element 30. As shown in half-cycle Coulomb oscillation characteristics in FIG. 8, when the gate voltage is shifted by Δ V/2, the input changes as follows: "0", "1", "0", "1". Therefore, in operation H, logical operation where the output is "1" only when the number of "1" input is odd numbers and the output is "0" in other cases is performed. In operation I, logical operation where the output is "1" only when the number of "1" input is even numbers and the output is "0" in other cases is performed.

In operations J, K, L, and M, by using a voltage difference of Δ V/4 (quarter cycle) between "0" input and "1" input, drain voltage is adjusted so that the same current value is exhibited as intermediate values on the positive slope before the current peak of Coulomb oscillation and on the negative slope after the peak when two gate voltages having voltage difference of Δ V/4 are applied to the logical operation element 30. As shown in quarter-cycle Coulomb oscillation characteristics in FIG. 4, if the gate voltage is shifted by Δ V/4, the input changes as follows: "0", "1", "1", "0".

Consequently, in operation J, logical operation where the output is "1" only when the number of "1" input is one or two, and the output is "0" in other cases is performed. In operation K, logical operation where the output is "1" only when the number of "1" input is zero, one, or four, and the output becomes "0" in other cases is performed. In operation L, logical operation where the output is "1" only when the number of "1" input is zero, three, or four, and the output is "0" in other cases is performed. In operation M, logical operation where the output is "1" only when the number of "1" input is two or three, and the output is "0" in other cases is performed.

In operations N, O, and P, the logical operation element 30 may also be allowed to perform the following operation: by using Δ V/3 as a voltage difference between "0" input and "1" input, the drain voltage is adjusted so that the same current value is exhibited as an intermediate value on the positive slope before the current peak of Coulomb oscillation and that on the negative slope after the peak when two gate voltages having voltage difference of Δ V/3 are applied.

When the gate voltage corresponding to operation N is set, logical operation N, where the output is "1" only when the number of "1" input is one, two, or four, and the output is "0" in other cases, is performed. When the gate voltage corresponding to operation O is set, logical operation O, where the output is "1" only when the number of "1" input is zero, one, three, or four, and the output is "0" in other cases, is performed.

When the gate voltage corresponding to operation P is set, logical operation P, where the output is "1" only when the number of "1" input is zero, two, or three, and the output is "0" in other cases, is performed.

Description of the method of setting the gate voltage to perform each logical operation shown at the bottommost column in FIG. 8 will be omitted because it is the same as the method shown in FIG. 4.

EXAMPLE 1

Figure 9:
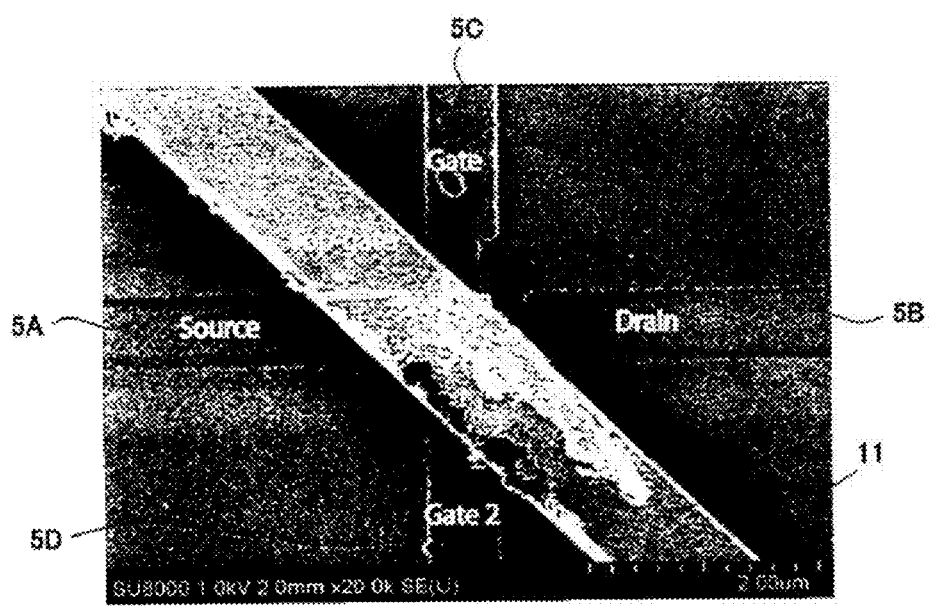
FIG. 9 is a SEM image of the logical operation element in production according to Example 1.

As Example 1, the logical operation element 10 as shown in FIG. 1 was produced by the following procedure. FIG. 9 is a SEM image of the logical operation element in production according to Example 1. The $SiO_2$ layer was formed as the first insulating layer 2 on the Si substrate 1 in the thermal CVD method, gold nanogap electrodes 5A and 5B were formed on it, and the gold nanoparticle 7 which has a core diameter of 6.2 nm was placed between the gold nanogap electrodes. The SiN passivation layer was formed as the second insulating layer 8 on the gold nanogap electrodes 5A and 5B and the $SiO_2$ layer 2.

The $Si_3N_4$ passivation layer was formed by the following procedure. The produced single electron transistor was put into the vacuum chamber, and the temperature was controlled by water cooling so that the temperature of the single electron transistor would not exceed 65 degree C. In this condition, silane gas, ammonia gas and hydrogen gas were introduced into the vacuum chamber, and the $SiN_x$ layer was deposited by the catalytic CVD method. In this Example 1, the $SiN_x$ passivation layer was cooled so that its temperature would not exceed 65 degree C. to prevent destroying the single electron transistor due to heating. Although temperature is required to be 170 degree C. or less for depositing the passivation layer, the sample is cooled to keep the temperature as low as possible, preferably 65 degree C. or less, when depositing the layer. When the thickness of the $SiN_x$ passivation layers was measured in ellipsometry measurement and by using a scanning electron microscope, the thickness was 50 nm in each case.

Then, a resist is applied to the sample, and by the electron beam lithography method, an electrode pattern was drawn immediately above the gold nanogap part. After development, a 30 nm Ti layer and a 70 nm Au layer were sequentially deposited by the electron beam evaporation. A top gate electrode 21 was thus formed directly above the gold nanogap via $Si_3N_4$ layer as a second insulating layer 8.

Figure 10:
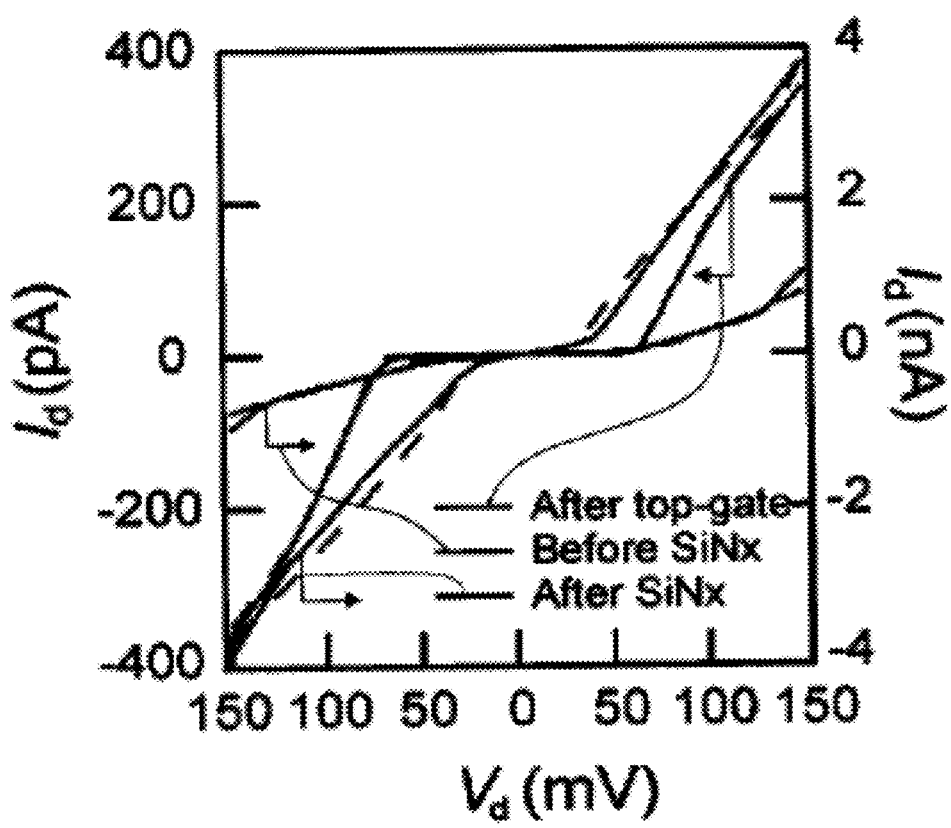
FIG. 10 is a chart showing drain current versus drain voltage of the sample produced in Example 1.

FIG. 10 is a chart showing drain current versus drain voltage of the sample produced in Example 1. The measurement temperature was set at 9K. The horizontal axis represents drain voltage $V_d$ (mV), left vertical axis represents drain current $I_d$ (pA), and the right vertical axis represents drain current $I_d$ (nA). The drain current before $SiN_x$ was deposited as a passivation film fell on a range around ±several hundred pA, whereas the drain current after $SiN_x$ was deposited was larger, falling within a range of ±400 pA, and the width of the drain voltage $V_d$ in a range where drain current $I_d$ was not fed is found to be larger. Furthermore, after the top gate was deposited, the drain current fell within a range of ±4 nA.

Figure 11:
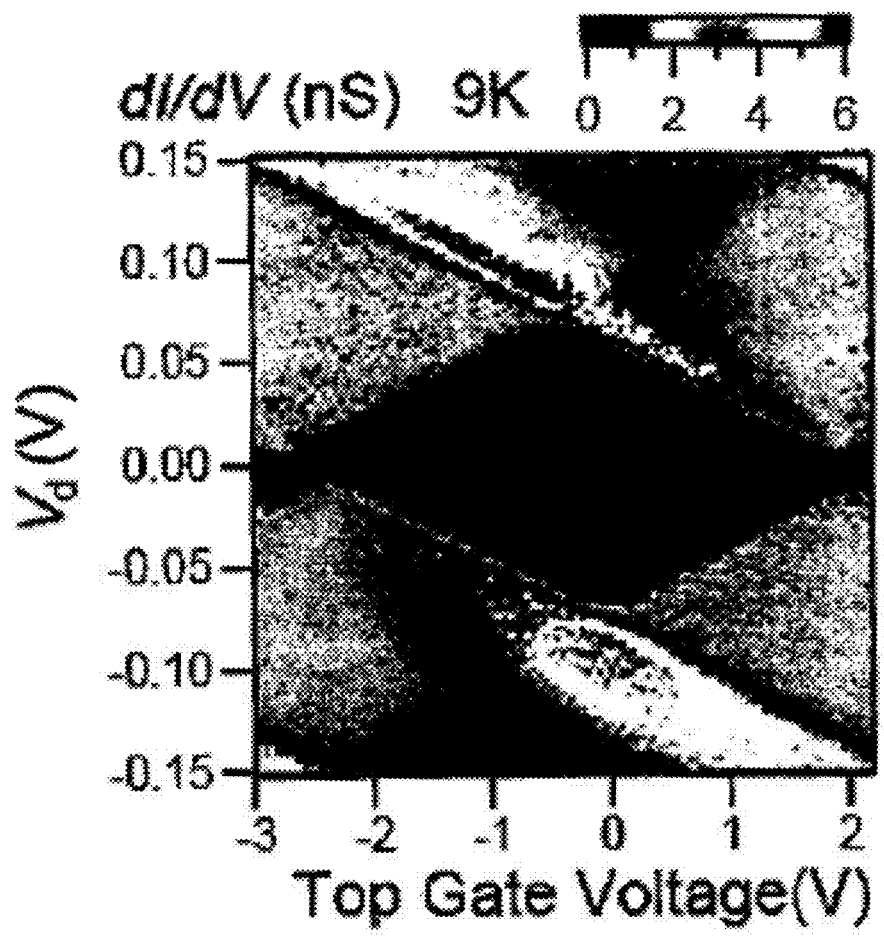
FIG. 11 is a chart showing differential conductance mapping (stability diagram) obtained when the top gate voltage and the drain voltage are respectively swept.

FIG. 11 is a chart showing differential conductance mapping (stability diagram) obtained when the top gate voltage and the drain voltage are respectively swept. The horizontal axis represents voltage (V) applied to the top gate, vertical axis represents drain voltage $V_d$ On, and shading represents differential conductance of the drain current (A). The measurement temperature was set at 9K. A voltage region in a shape of a parallelogram so called Coulomb diamond resulting from the suppression of current (Coulomb blockade) via a Coulomb island between the drain and the source is found, which means that the element is functioning as a single electron transistor. In addition, coincidence with theoretical calculation value was confirmed.

Figure 12:
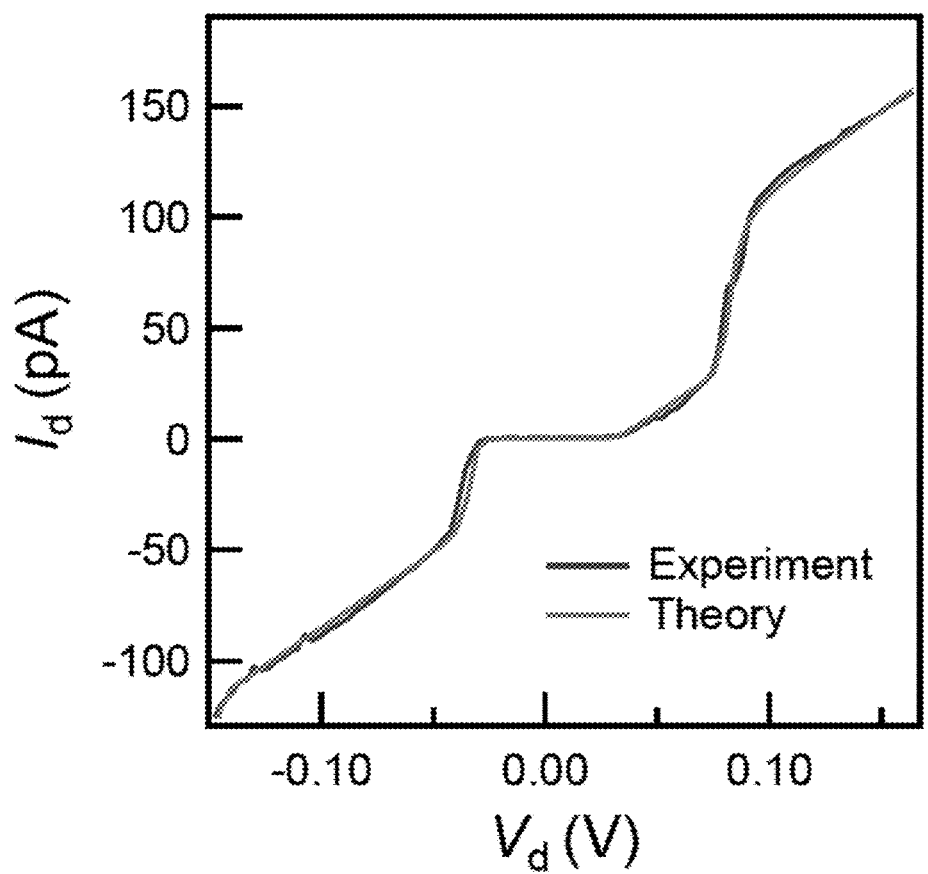
FIG. 12 is a chart showing the dependency of drain current on drain voltage.

FIG. 12 is a chart showing the dependency of drain current on drain voltage. The horizontal axis represents the drain voltage $V_d$ (V), and the vertical axis represents the drain current $I_d$ (pA). The chart shows that there is a range where drain current is not fed despite the increase/decrease in the drain voltage, meaning that apparent Coulomb staircase characteristics are observed and that the sample produced in Example 1 is functioning as a single electron transistor. This result coincides with theoretical calculation.

Figure 13:
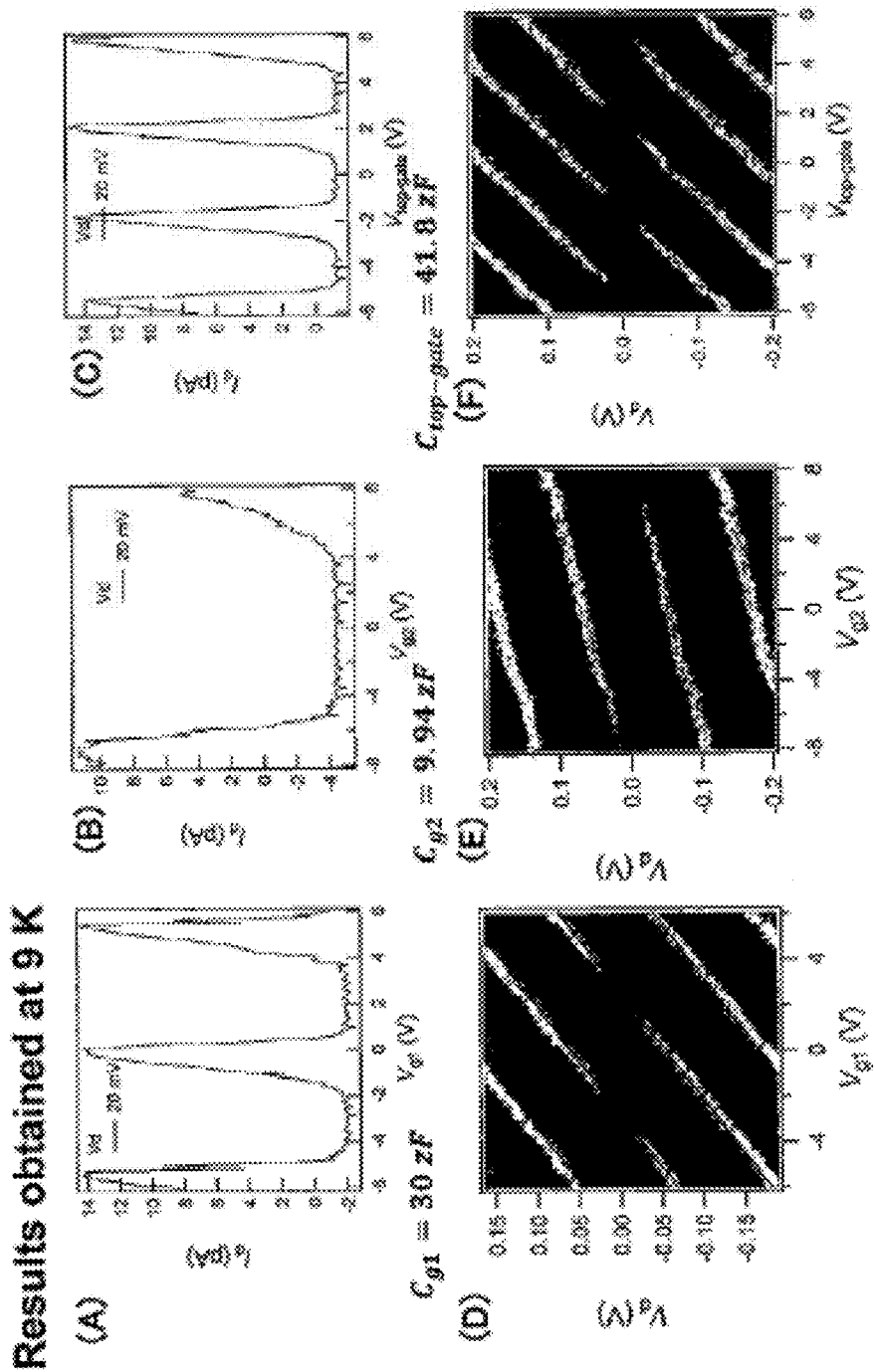
FIG. 13 (A) is a chart showing the dependency of drain current on first side gate voltage, (B) is a chart showing the dependency of drain current on second side gate voltage, (C) is a chart showing the dependency of drain current on top gate voltage, (D) is a chart showing differential conductance characteristics obtained when the first side gate voltage and the drain voltage are changed, (E) is a chart showing differential conductance characteristics obtained when the second side gate voltage and the drain voltage are changed, and (F) is a chart showing differential conductance characteristics obtained when the top gate voltage and the drain voltage are changed.

FIG. 13 (A) is a chart showing the dependency of drain current on first side gate voltage (Coulomb oscillation characteristics), (B) is a chart showing the dependency of drain current on second side gate voltage (Coulomb oscillation characteristics), (C) is a chart showing the dependency of drain current on top gate voltage (Coulomb oscillation characteristics), (D) is a chart showing differential conductance $(dI_d/dV_d)$ characteristics obtained when the first side gate voltage and the drain voltage are changed, (E) is a chart showing differential conductance $(dI_d/dV_d)$ characteristics obtained when the second side gate voltage and the drain voltage are changed, and (F) is a chart showing differential conductance $(dI_d/dV_d)$ characteristics obtained when the top gate voltage and the drain voltage are changed. The measurement temperature was 9K.

The vertical axis in FIGS. 13 (A) to (C) represents drain current $I_d$ (pA), the vertical axis in (D) to (F) represents drain voltage $V_d$ (V), the horizontal axis in (A) and (D) represents first side gate voltage $V_{g1}$ (V), the horizontal axis in (B) and (E) represents second side gate voltage $V_{g2}$ (V), and the horizontal axis in (C) and (F) represents top gate voltage $V_{top\text{-}gate}$ (V).

FIGS. 13 (A), (B) and (C) respectively show Coulomb oscillation characteristics for gate voltages $V_{g1}$, $V_{g2}$, $V_{top\text{-}gate}$. A region where current is not fed and slopes having positive and negative inclinations are found to form peak current. In FIGS. 13 (A) and (C), multiple current peaks are observed, and gate capacity C is calculated by $C=e/\Delta V$, where $\Delta V$ is a voltage difference between peaks. In FIG. 13 (B), since the gate capacity is small, Coulomb oscillation for one cycle cannot be observed, but that for almost one cycle is observed.

FIGS. 13 (D), (E), and (F) show Coulomb diamond characteristics for respective gate voltages. In a region enclosed by a parallelogram near $V_d$=0 V in the direction of the gate voltage, current is not fed due to Coulomb blockade. Corresponding to Coulomb oscillation characteristics, the parallelograms having apexes in the direction of the gate voltage lie in a row.

Figure 14:
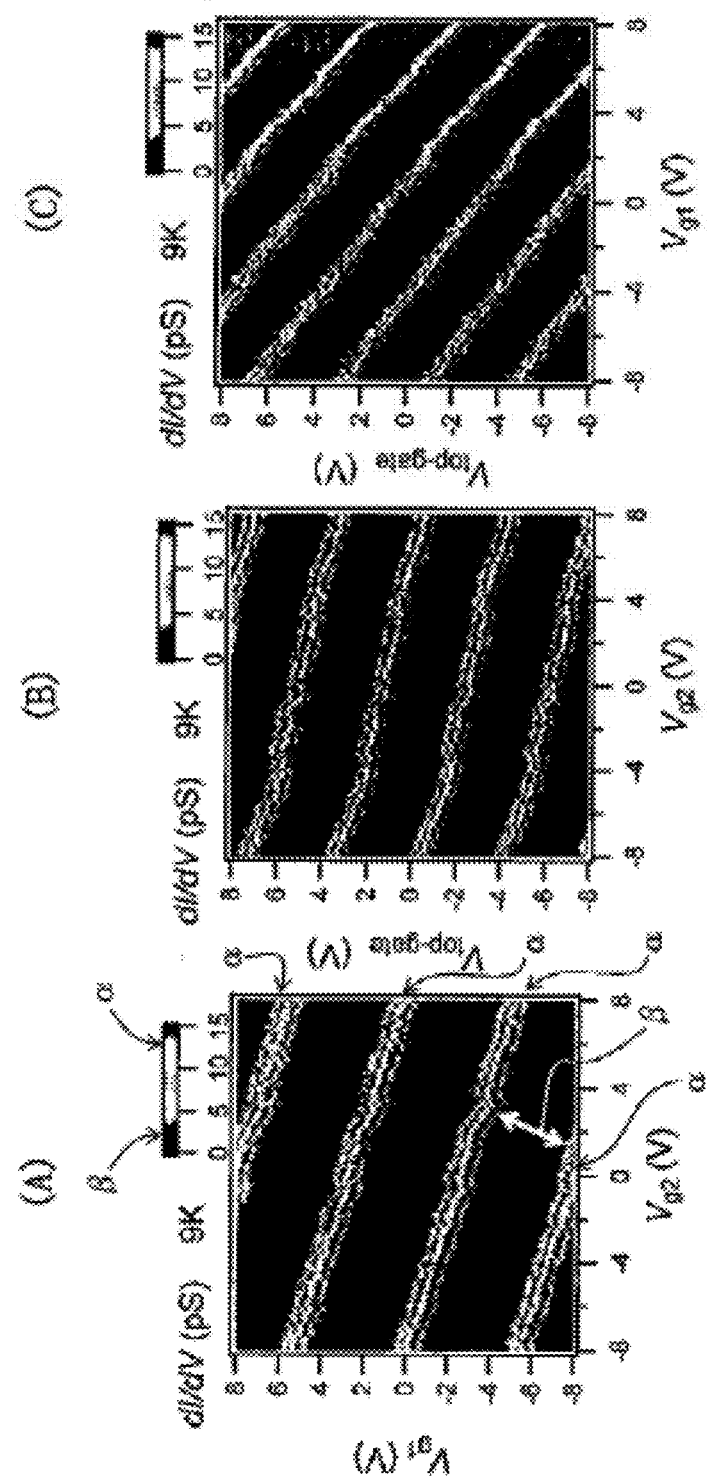
FIG. 14 is a chart showing the dependency of differential conductance on the voltage applied to two arbitrary gates, where (A) shows the dependency of differential conductance on the first side gate voltage and the second side gate voltage, (B) shows the dependency of differential conductance on the second gate voltage and the top gate voltage, and (C) shows the dependency of differential conductance on the first side gate voltage and the top gate voltage.

FIG. 14 is a chart showing the dependency of differential conductance on the voltage applied to two arbitrary gates, where (A) shows the dependency of differential conductance on the first side gate voltage and the second side gate voltage, (B) shows the dependency of differential conductance on the second gate voltage and the top gate voltage, and (C) shows the dependency of differential conductance on the first side gate voltage and the top gate voltage. The part shown as α corresponds to peak current on two arbitrary voltage, and in the region shown as β, current is not fed due to Coulomb blockade. Since the peak current shown as α is observed as an aggregation of parallel lines, it is anticipated that logical operation can be performed simultaneously with three gates of a single device.

Figure 15:
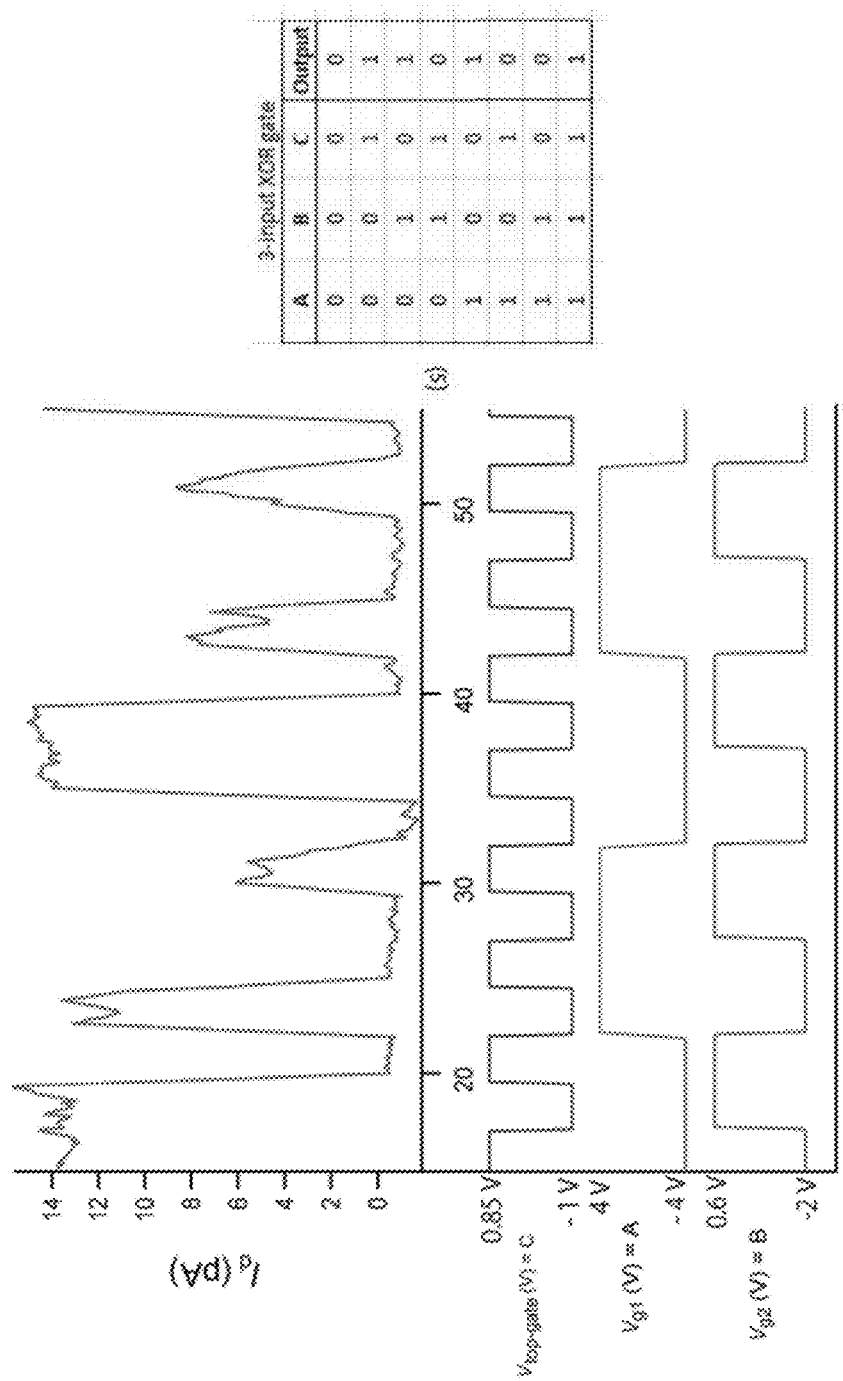
FIG. 15 is a chart showing the characteristics of the logical operation element produced in Example 1.

FIG. 15 is a chart showing the characteristics of the logical operation element produced in Example 1. As described previously, to allow the gate voltage equivalent to $\Delta V/2$ to become values corresponding to "0" and "1" inputs of the three gate voltages, −1 V and 0.85 V of $V_{top\text{-}gate}$ were respectively made to be values corresponding to "0" and "1" inputs, −4 V and 4 V of $V_{g1}$ were respectively made to be values corresponding to "0" and "1" inputs, and −2 V and 0.6 V of $V_{g2}$ were respectively made to be values corresponding to "0" and "1" inputs.

FIG. 15 shows that the drain current exhibits XOR output in response to the pulse voltage waveform input of the first side gate voltage, second side gate voltage, and top gate voltage. The ON/OFF ratio was 10, and operation temperature was 9K.

EXAMPLE 2

The element in Example 2 was produced by the same method as Example 1 except that a 50 nm $Al_2O_3$ layer was formed as a second insulating layer 8 by the pulse laser deposition method. The environment for the subsequent measurements was 9K.

Figure 16:
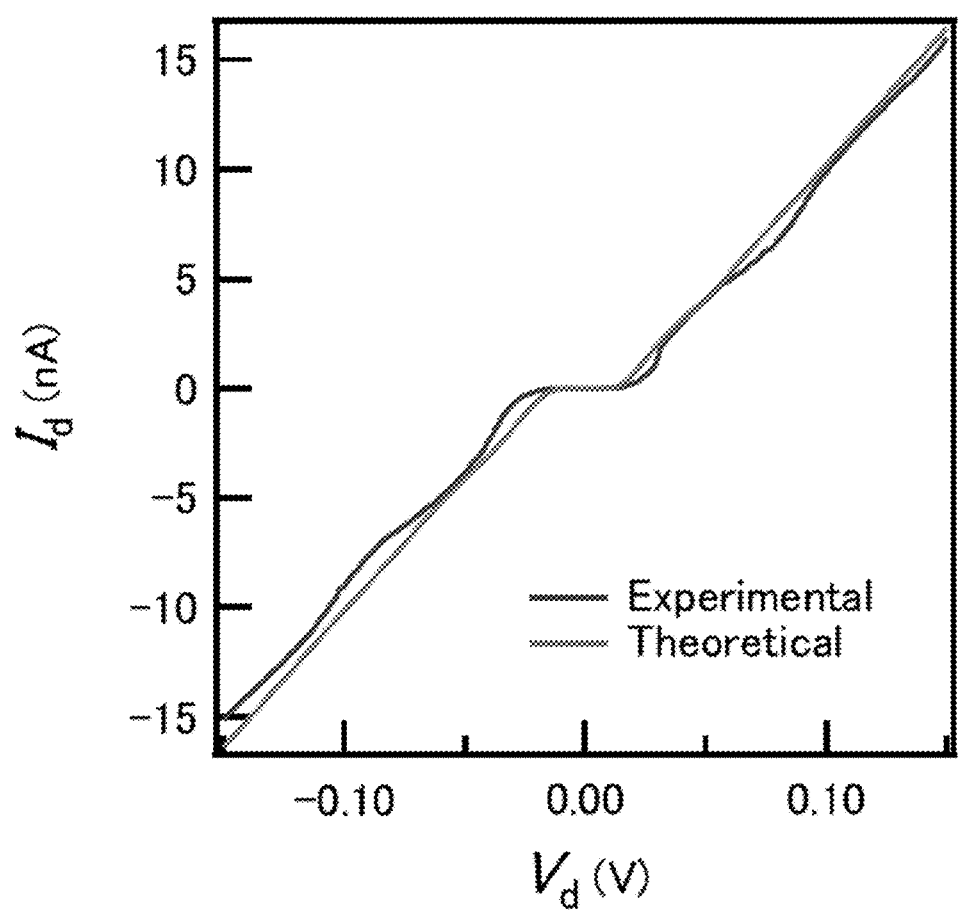
FIG. 16 is a chart showing the dependency of drain current on drain voltage.

FIG. 16 is a chart showing the dependency of drain current on drain voltage. The horizontal axis represents drain voltage $V_d$ (V), and the vertical axis represents drain current $I_d$ (nA). The figure shows a region where the drain current is not fed despite the increase/decrease of the drain voltage. Apparent Coulomb staircase characteristics were thus observed, which means that the sample produced in Example 2 was functioning as a single electron transistor. Coincidence with theoretical calculation was also confirmed.

Figure 17:
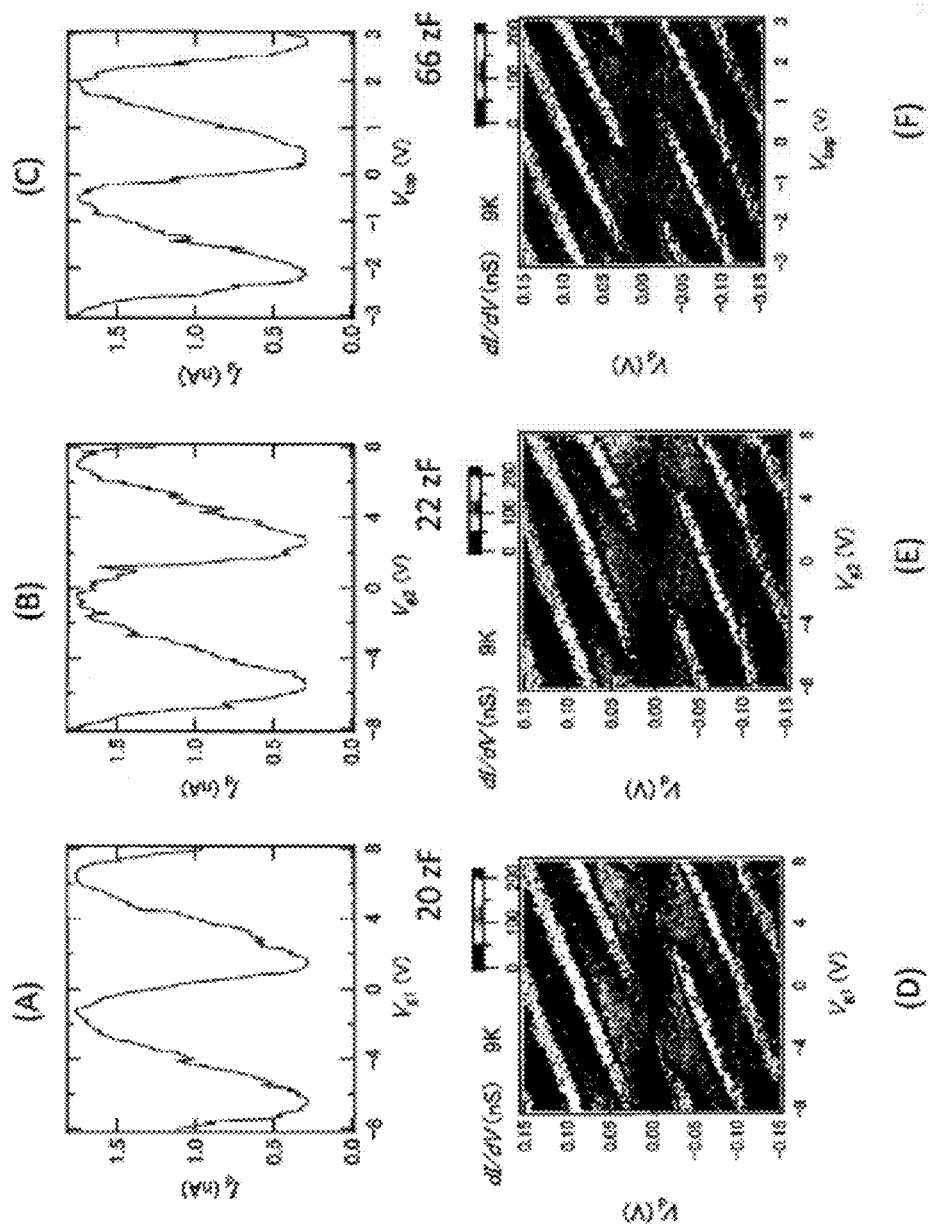
FIGS. 17 (A), (B), and (C) are respectively a chart showing Coulomb oscillation characteristics for gate voltages $V_{g1}$, $V_{g2}$, and $V_{top\text{-}gate}$, and (D), (E), and (F) are respectively a chart showing Coulomb diamond characteristics for respective gate voltages.

FIGS. 17 (A), (B), and (C) respectively show Coulomb oscillation characteristics for gate voltages $V_{g1}$, $V_{g2}$, and $V_{top\text{-}gate}$, and (D), (E), and (F) show Coulomb diamond characteristics for respective gate voltages. The vertical axis in FIGS. 17 (A) to (C) represents drain current $I_d$ (nA), the vertical axis in (D) to (F) represents drain voltage $V_d$ On, the horizontal axis in (A) and (D) represents first side gate voltage $V_{g1}$ On, the horizontal axis in (B) and (E) represents second side gate voltage $V_{g2}$ On, and the horizontal axis in (C) and (F) represents top gate voltage $V_{top\text{-}gate}$ (V).

In FIGS. 17 (A) to (C), a region where current is not fed and slopes having positive and negative inclinations are found to form peak current. In FIGS. 17 (A), (B), and (C), multiple current peaks are observed, and gate capacity C is calculated by $C=e/\Delta V$, where $\Delta V$ is voltage difference between peaks.

In a region enclosed by a parallelogram around $V_d=0$ V in the direction of gate voltage in FIGS. 17 (D) to (F), current is not fed due to Coulomb blockage. Corresponding to Coulomb oscillation characteristics, the parallelograms having apexes in the direction of the gate voltage lie in a row. As described above, apparent Coulomb oscillation characteristics and Coulomb diamond characteristics were observed.

Figure 18:
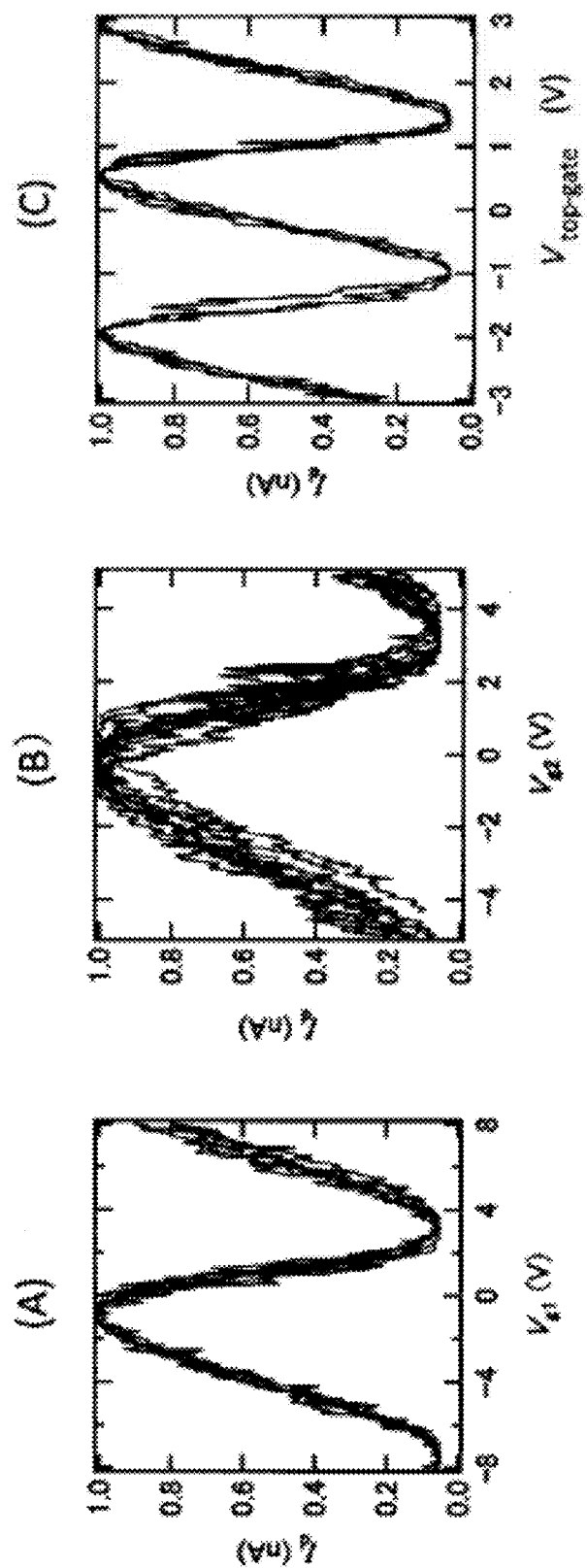
FIGS. 18 (A), (B), and (C) are respectively a chart showing the results of repetitive measurement of Coulomb oscillation characteristics for respective gate voltages $V_{g1}$, $V_{g2}$, and $V_{top\text{-}gate}$.

FIGS. 18 (A), (B), and (C) show the results of repetitive measurement of Coulomb oscillation characteristics for respective gate voltages $V_{g1}$, $V_{g2}$, and $V_{top\text{-}gate}$. $V_d$ was set at 10 mV. The vertical and horizontal axes in the figures represent the same items as in FIGS. 17 (A), (B), and (C). The figures indicate that stable Coulomb oscillation was observed. Coulomb diamond characteristics were also observed with good reproducibility.

Unlike Example 1, the drain current was not on the order of pA but on the order of nA. The Coulomb oscillation was found to be stabler than Example 1. With a single electron transistor, if trapped charge around a single electron island changes, output current (drain current) fluctuates. When $Al_2O_3$ is used as a passivation film, current fluctuation is smaller than when $SiN_x$ is used, which means that the $Al_2O_3$ insulating film produced by the pulse laser deposition method is appropriate as a passivation layer of a single electron transistor from the viewpoint that trapped charge is less likely to change. Not only $Al_2O_3$ and $SiN_x$ films but also films whose trapped charge is less likely to change, such as high-dielectric-constant insulating layers including $SiO_2$ layer and $HfO_x$, are appropriate.

Figure 19:
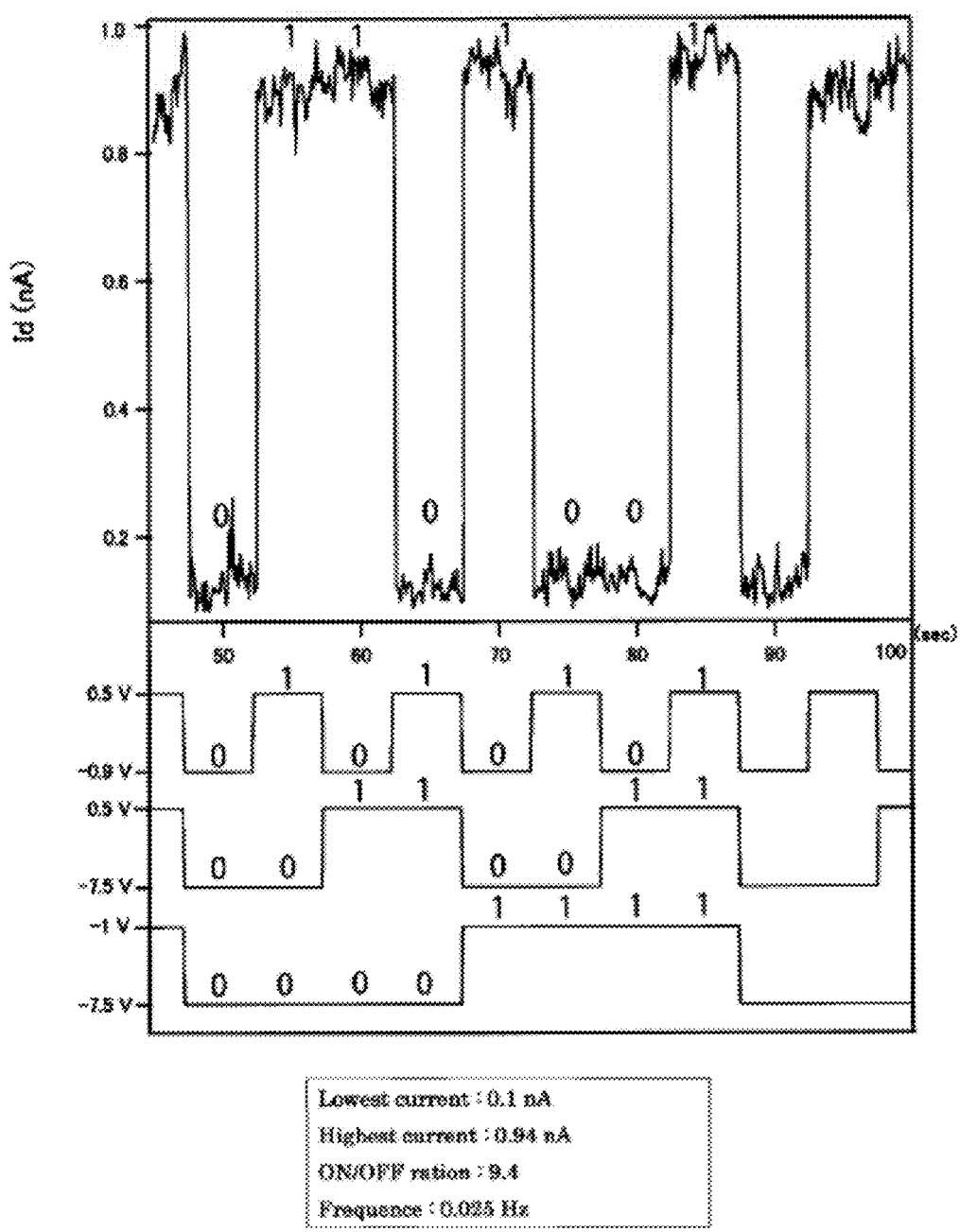
FIG. 19 is a chart showing a characteristics of the logical operation element produced in Example 2.

FIG. 19 is a chart showing the characteristics of the logical operation element produced in Example 2. As described previously, to allow the gate voltage equivalent to $\Delta V/2$ to be values corresponding to "0" and "1" inputs of the three gate voltages, −0.9 V and 0.5 V of $V_{top\text{-}gate}$ were respectively made to be values corresponding to "0" and "1" inputs, −7.5 V and 0.5 V of $V_{g1}$ were respectively made to be values corresponding to "0" and "1" inputs, and −7.5 V and −1 V of $V_{g2}$ were respectively made to be values corresponding to "0" and "1" inputs.

FIG. 19 shows that the drain current exhibits XOR output depending on the pulse voltage waveform input of the first side gate voltage, the second side gate voltage, and the top gate voltage. The ON/OFF ratio was 9.4, and operation temperature was 9K.

In FIG. 19, since the current value corresponding to "0" output is approximately 0.1 nA, and the current corresponding to "1" output is approximately 0.9 nA, the ON/OFF ratio is approximately 9. The current value at the time of "0" output is 0.1 nA because leakage current is fed between the source electrode and the drain electrode. FIG. 19 shows XOR characteristics, but as described previously, by shifting the gate voltage by a half cycle, XNOR characteristics were confirmed to be exhibited. Furthermore, if voltage difference such as $\Delta V/3$ and $\Delta V/4$ is adopted instead of $\Delta V/2$, various logical operations are allowed as shown in the truth table in FIG. 4.

Figure 20:
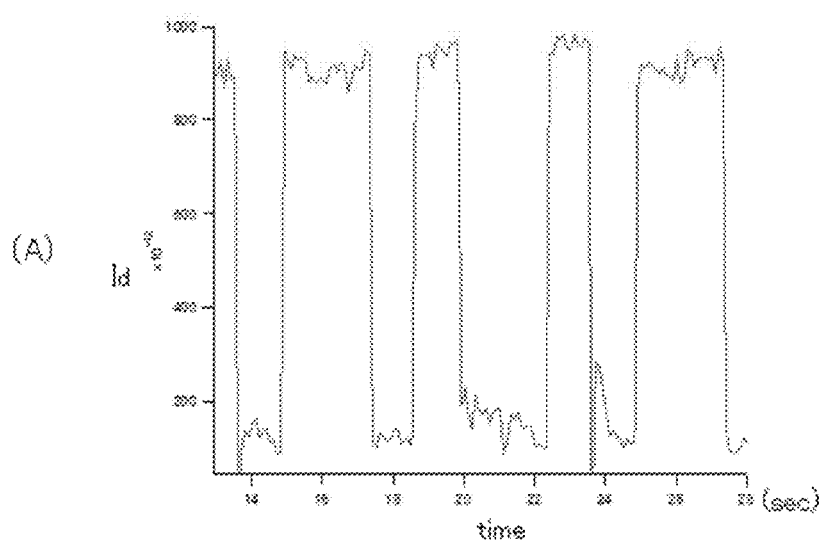
FIG. 20 (A) is a chart showing a result of operation of the logical operation element at frequency of 1 Hz, and (B) is a chart showing a result of operation of the logical operation element at frequency of 10 Hz.
Figure 20:
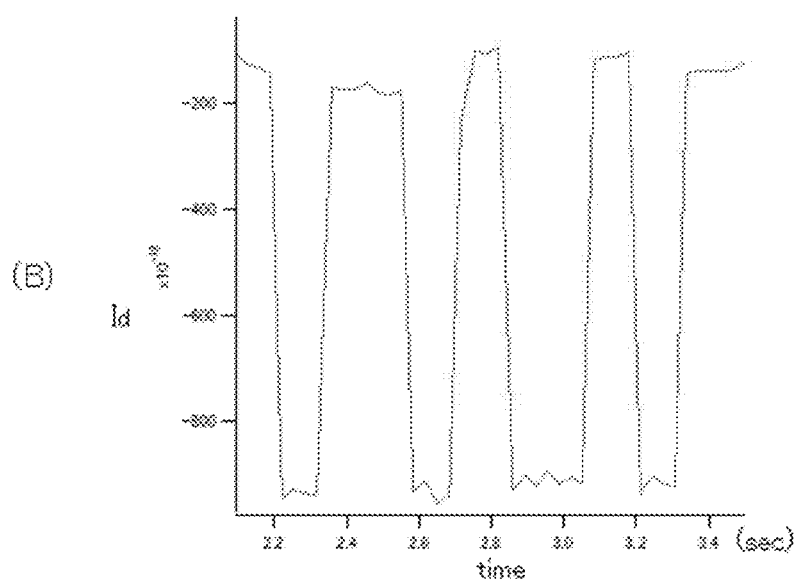

Then, the operation of the logical operation element produced in Example 2 was checked by increasing frequency to 1 Hz and 10 Hz. FIGS. 20 (A) and (B) show the result of operation of the logical operation element at respective frequencies of 1 Hz and 10 Hz. The characteristics of the logical operation element were confirmed to be maintained even if the frequency was increased.

The present invention is not limited to the Embodiments and Examples, but can be modified in various ways for use within the range of the invention indicated in the scope of the patent claims.

According to the embodiment of the present invention, a logical operation element that combines three or more gates, out of two side gates, a top gate, and a bottom gate, can be provided by applying a single electron transistor using a metal nanoparticle and a functional particle. Furthermore, by combining a logical operation element according to the embodiment of the present invention with a CMOS circuit, a logical operation circuit with higher integration and function can be provided.

What is claimed is:

1. A logical operation element, comprising:
   first and second electrodes provided to have a nanogap therebetween;
   two disparate monolayers comprised of a first alkanethiol layer and a second additional monolayer;
   a metal nanoparticle protected by the first alkanethiol layer, the metal nanoparticle being arranged between the first and second electrodes in insulated state;
   the second additional monolayer provided on at least one of the electrodes and between the metal nanoparticle and the first electrode or between the metal nanoparticle and the second electrode; and
   a plurality of gate electrodes for adjusting a charge of the metal nanoparticle;
   wherein electric current flowing between the first electrode and the second electrode is controlled according to voltage applied to three or more electrodes of the plurality of gate electrodes, and
   voltage corresponding to "0" or "1" is applied to three or more electrodes of the plurality of gate electrodes; the charge of the metal nanoparticle is changed according to each input to the voltage so that logical operation is performed; and electric current flowing between the first electrode and the second electrode is controlled to correspond to "0" or "1".

2. The logical operation element as set forth in claim 1, wherein the three or more gate electrodes comprise two side gate electrodes and a top gate electrode.

3. The logical operation element as set forth in claim 1, wherein the three or more gate electrodes comprise two side gate electrodes and a bottom gate electrode.

4. The logical operation element as set forth in claim 1, wherein the three or more gate electrodes comprise two side gate electrodes, a top gate electrode, and a bottom gate electrode.

5. The logical operation element as set forth in claim 2, wherein the first electrode, the second electrode and two side gate electrodes are provided on a first insulating layer, a second insulating layer is provided on the first insulating layer to embed the first electrode, the second electrode, the two side gate electrodes, and the metal nanoparticle, and the top gate electrode is provided on the second insulating layer and above the metal nanoparticle.

6. The logical operation element as set forth in claim 1, wherein the three or more gate electrodes comprise a side gate electrode, a top gate electrode, and a bottom gate electrode, a face where the bottom gate electrode exists, a face where the side gate electrodes exist, and a face where the top gate electrode exists are separated in the vertical direction, and the metal nanoparticle is provided to be embedded in the insulating layer at a position above the bottom gate electrode and beneath the top gate electrode.

7. The logical operation element as set forth in claim 1, wherein a relationship between an input of voltage applied to the three or more gate electrodes and an output of electric current through the metal nanoparticle between the first electrode and the second electrode is XOR or XNOR.

8. The logical operation element as set forth in claim 1, wherein, a value is set as a potential difference corresponding to input of High and Low of voltage applied to the three or more gate electrodes, the value corresponds to both ends of one of divisions of voltage difference $\Delta V$ between gate voltage to provide peak current in Coulomb oscillation for one cycle and gate voltage to provide next peak current, the voltage difference $\Delta V$ is equally divided into two, three, or four equal parts.

9. The logical operation element as set forth in claim 4, wherein the first electrode, the second electrode and two side gate electrodes are provided on a first insulating layer, a second insulating layer is provided on the first insulating layer to embed the first electrode, the second electrode, the two side gate electrodes, and the metal nanoparticle, and the top gate electrode is provided on the second insulating layer and above the metal nanoparticle.

10. The logical operation element as set forth in claim 1, wherein a relation between an input of voltage applied to the three or more gate electrodes and an output of electric current flowing between the first electrode and the second electrode is one of the following:

1st relation: when voltage corresponding to "0" or "1" is applied to three gate electrodes, electric current corresponding to "1" is output;

2nd relation: when voltage corresponding to "0" or "1" is applied to three gate electrodes, electric current corresponding to "0" is output;

3rd relation: when voltage corresponding to "0" is applied to two or three gate electrodes of three gate electrodes, electric current corresponding to "1" is output;

4th relation: when voltage corresponding to "1" is applied to two or three gate electrodes of three gate electrodes, electric current corresponding to "1" is output;

5th relation: when voltage corresponding to "1" is applied to two or three gate electrodes of three gate electrodes or when voltage corresponding to "0" is applied to three gate electrodes, electric current corresponding to "1" is output;

6th relation: when voltage corresponding to "1" is applied to one or three gate electrodes of three gate electrodes or when voltage corresponding to "0" is applied to three gate electrodes, electric current corresponding to "1" is output;

7th relation: when voltage corresponding to "1" is applied to one or two gate electrodes of three gate electrodes, electric current corresponding to "1" is output.

11. The logical operation element as set forth in claim 1, wherein a relation between an input of voltage applied to the three or more gate electrodes and an output of electric current flowing between the first electrode and the second electrode is one of the following:

1st relation: when voltage corresponding to "1" is applied to odd number pieces of four gate electrodes, electric current corresponding to "1" is output;

2nd relation: when voltage corresponding to "1" is applied to even number pieces of four gate electrodes or when voltage corresponding to "0" is applied to four gate electrodes, electric current corresponding to "1" is output;

3rd relation: when voltage corresponding to "1" is applied to one or two gate electrodes of four gate electrodes, electric current corresponding to "1" is output;

4th relation: when voltage corresponding to "1" is applied to one or four gate electrodes of four gate electrodes or when voltage corresponding to "0" is applied to four gate electrodes, electric current corresponding to "1" is output;

5th relation: when voltage corresponding to "1" is applied to three or four gate electrodes of four gate electrodes or when voltage corresponding to "0" is applied to four gate electrodes, electric current corresponding to "1" is output;

6th relation: when voltage corresponding to "1" is applied to two or three gate electrodes of four gate electrodes, electric current corresponding to "1" is output;

7th relation: when voltage corresponding to "1" is applied to one or two or four gate electrodes of four gate electrodes, electric current corresponding to "1" is output;

8th relation: when voltage corresponding to "1" is applied to one or three or four gate electrodes of four gate electrodes or when voltage corresponding to "0" is applied to four gate electrodes, electric current corresponding to "1" is output;

9th relation: when voltage corresponding to "1" is applied to two or three gate electrodes of four gate electrodes or when voltage corresponding to "0" is applied to four gate electrodes, electric current corresponding to "1" is output.

12. The logical operation element as set forth in claim 1, wherein the second additional monolayer is self-assembled monolayer.

13. The logical operation element as set forth in claim 1, wherein the metal nanoparticle is fixed to the second additional monolayer via the first alkanethiol layer.

* * * * *